United States Patent
Dunstan et al.

(10) Patent No.: US 7,835,414 B2
(45) Date of Patent: Nov. 16, 2010

(54) LASER GAS INJECTION SYSTEM

(75) Inventors: Wayne J. Dunstan, San Diego, CA (US); Kevin M. O'Brien, San Diego, CA (US); Robert N. Jacques, San Diego, CA (US); Herve A. Besaucele, San Diego, CA (US); Aravind Ratnam, San Diego, CA (US)

(73) Assignee: Cymer, Inc., San Diego, CA (US)

( * ) Notice: Subject to any disclaimer, the term of this patent is extended or adjusted under 35 U.S.C. 154(b) by 6 days.

(21) Appl. No.: 11/796,065

(22) Filed: Apr. 25, 2007

(65) Prior Publication Data

US 2008/0205472 A1 Aug. 28, 2008

Related U.S. Application Data

(60) Provisional application No. 60/903,727, filed on Feb. 26, 2007.

(51) Int. Cl.
*H01S 3/22* (2006.01)

(52) U.S. Cl. ............... 372/59; 372/55; 372/58

(58) Field of Classification Search ............ 372/59
See application file for complete search history.

(56) References Cited

U.S. PATENT DOCUMENTS

| | | | | |
|---|---|---|---|---|
| 6,130,904 A | * | 10/2000 | Ishihara et al. | 372/59 |
| 6,389,052 B2 | * | 5/2002 | Albrecht et al. | 372/58 |
| 6,392,743 B1 | | 5/2002 | Zambon et al. | 355/69 |
| 6,490,307 B1 | * | 12/2002 | de Mos et al. | 372/59 |
| 6,490,308 B2 | * | 12/2002 | Albrecht et al. | 372/59 |
| RE38,054 E | | 4/2003 | Hofmann et al. | 372/25 |
| 6,839,375 B1 | | 1/2005 | Lokai et al. | 372/92 |
| 6,879,617 B2 | * | 4/2005 | Ariga et al. | 372/55 |

(Continued)

OTHER PUBLICATIONS

Dunstan, Wayne J.; Jacques, Robert; O'Brien, Kevin O.; Ratnam, Aravind, "Increased Availability of Lithography Light Sources using Advanced Gas Management," SPIE Proceedings, Optical Microlithography XX, vol. 6520, Mar. 26, 2007.

(Continued)

*Primary Examiner*—Minsun Harvey
*Assistant Examiner*—Phillip Nguyen

(57) ABSTRACT

A method and apparatus are disclosed which may comprise predicting the gas lifetime for a gas discharge laser light source for a photolithography process, the light source comprising a halogen containing lasing gas may comprise: utilizing at least one of a plurality of laser operating input and/or output parameters; utilizing a set of at least one parameter of utilization in the photolithography process to determine a gas use model in relation to the respective input or output parameter; predicting the end of gas life based upon the model and a measurement of the respective input or output parameter. The parameter may comprise a pulse utilization pattern. The method and apparatus may comprise performing gas management for a gas discharge laser light source for a photolithography process, the light source comprising a halogen containing lasing gas comprising: utilizing periodic and frequent partial gas refills comprising an inject comprising a mixture of halogen gas and bulk gas in generally the same ration as the premix ratio provided to the laser in a full gas refill, and in an amount less than two percent of the total gas pressure prior to the injection.

10 Claims, 18 Drawing Sheets

U.S. PATENT DOCUMENTS

| | | | |
|---|---|---|---|
| 6,963,595 B2 | 11/2005 | Rule et al. | 372/55 |
| 7,039,086 B2 | 5/2006 | Fallon et al. | 372/55 |
| 7,079,564 B2 | 7/2006 | Fallon et al. | 372/55 |
| 7,209,507 B2 | 4/2007 | Rule et al. | 372/58 |
| 7,266,137 B2 * | 9/2007 | Albrecht et al. | 372/59 |
| 7,277,464 B2 | 10/2007 | Rule et al. | 372/59 |
| 7,372,887 B2 * | 5/2008 | Matsunaga et al. | 372/59 |
| 2002/0021731 A1 | 2/2002 | Bragin et al. | 372/57 |
| 2002/0031159 A1 | 3/2002 | Serwazi et al. | 372/55 |
| 2004/0141182 A1 | 7/2004 | Schroder et al. | 356/454 |
| 2005/0094698 A1 | 5/2005 | Besaucele et al. | 372/57 |
| 2006/0239322 A1 * | 10/2006 | Matsunaga et al. | 372/58 |

OTHER PUBLICATIONS

PCT Search Report dated Aug. 8, 2008, International Patent Application No. PCT/US08/001348 filed Jan. 2, 2008 (10 pages).

* cited by examiner

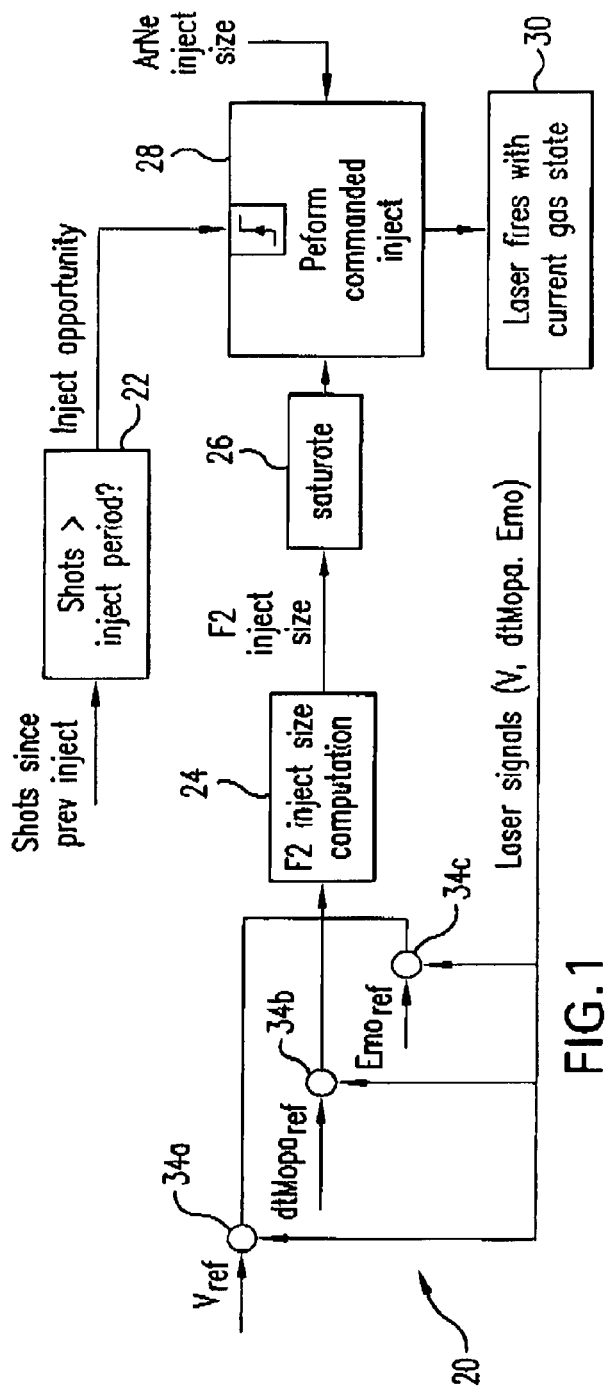
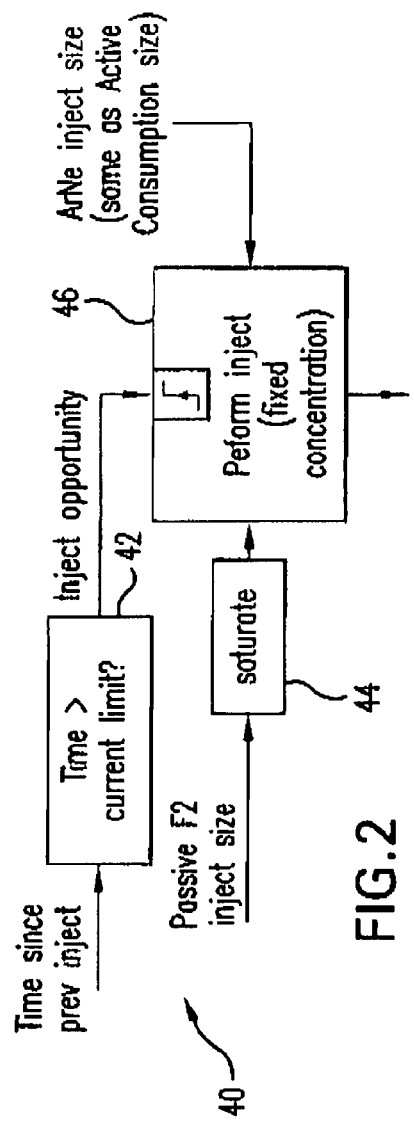
FIG.1
FIG.2

LASER GAS INJECTION SYSTEM

CROSS-REFERENCE TO RELATED APPLICATIONS

This application claims the benefit of U.S. Application No. 60/903,727, filed on Feb. 26, 2007, entitled "LASER GAS INJECTION SYSTEM". The present application is related to U.S. Pat. No. 6,392,743, entitled CONTROL TECHNIQUE FOR MICROLITHOGRAPHY LASERS, issued on May 21, 2002, and U.S. Pat. No. 6,963,595, entitled AUTOMATIC GAS CONTROL SYSTEM FOR A GAS DISCHARGE LASER, issued on Nov. 8, 2005, and U.S. Pat. No. 7,079,564, issued on Dec. 1, 2005, entitled CONTROL SYSTEM FOR TWO CHAMBER GAS DISCHARGE LASER, and U.S. Pat. No. 7,039,086, issued on Mar. 25, 2004, entitled CONTROL SYSTEM FOR TWO CHAMBER GAS DISCHARGE LASER, and is also related to U.S. patent applications Ser. No. 11/035,938, entitled METHOD AND APPARATUS FOR CONTROLLING THE OUTPUT OF A GAS DISCHARGE MOPA LASER SYSTEM, Jan. 13, 2005, and Ser. No. 10/953,100, filed on Sep. 29, 2004, entitled MULTI-CHAMBERED EXCIMER OR MOLECULAR FLUORINE GAS DISCHARGE LASER FLUORINE INJECTION CONTROL, Published on May 5, 2005, Pub. No. 20050094698, and Ser. No. 10/740,659, entitled METHOD AND APPARATUS FOR CONTROLLING THE OUTPUT OF A GAS DISCHARGE MOPA LASER SYSTEM, filed on Dec. 18, 2003, Published on Jun. 23, 2005, Pub. No. 20050238027, the disclosures of each of which are incorporated herein by reference.

FIELD

The disclosed subject matter relates to gas discharge lasers particularly excimer gas discharge lasers utilized in a line narrowed environment such as for DUV light sources for semiconductor manufacturing photolithography and more particularly to apparatus and means for controlling the output of the laser including laser gas replenishment.

BACKGROUND

Increasing throughput demands on leading edge scanners are requiring greatly improved light source availability. This can translate directly to minimizing downtime and maximizing productive time, as defined in the SEMI E10 standard. Focused efforts to achieve these goals are ongoing and have already yielded significant improvements on production light sources. One positive contributor to improving productive time can be minimization of the light source stoppage for halogen gas replenishment. Applicants' assignee's laser systems employ one or more halogen gas filled chambers as a gain medium. As the light source operates, the halogen gas is depleted and contaminants accumulate, so the gas must be periodically replenished.

This can be done by a partial replenishment while the light source continues to operate, called an inject, that is subject to constraints to ensure the light properties remain within predetermined selected specifications for certain laser output parameters. Alternatively, it may be done with a full replenishment, called a refill, where all of the chamber gas is replaced while the laser is not firing to return the gas content in the laser to an originally selected pre-mix concentration such as 0.1% $F_2$, 1.9% Ar and 98% neon. Refills are to be minimized because of the large disruption they introduce to both the light source and scanner operation. Continued pressures from the end users of the light sources, e.g., semiconductor manufacturers for increasingly narrow bandwidth and increasing pulse to pulse stability for bandwidth and a number of other beam quality parameters are influenced by many factors in the operation of such excimer laser photolithography DUV light sources. These include current gas composition and changes in gas composition over time, and also including issues of operating efficiency and economy, such as need to operate the scanner even while gas composition is being modified by a gas composition control system and down time due to periodic gas refill requirements. Certain weaknesses in one or more of the systems discussed in the above referenced issued patents and pending applications have thereby been exposed.

Applicants' assignee, Cymer, Inc. has proposed and adopted a number of laser gas control methods and apparatus both for single chamber and multi-chamber line narrowed laser systems, such as those that are utilized on semiconductor manufacturing photolithography as very narrow bandwidth, high pulse repetition rate, high power, extremely stable, pulse to pulse, DUV light sources, e.g., for use in scanners. For example, U.S. application Ser. No. 10/953,100, referenced above, describes how the amount of halogen to use in a gas replacement can be computed, and how it can be determined when the gas replacement occurs.

Along with improvements to gas management, major efforts in light source fault reduction, module lifetime extension and optimization of module replacement, can provide significantly increased combined light source\scanner availability. As throughput demands increase on leading edge scanners, a greater focus on minimizing downtime and maximizing productive time becomes essential. In the past, cutting edge light sources have focused primarily on delivering the high performance requirements demanded by the lithographic process. However light source manufacturers have an increasing responsibility to ensure that the light source delivers improved availability as the product matures. The SEMI E10 standard defines downtime to include preventative maintenance and replacement of consumables, such as light source chambers and optics. The SEMI E10 standard, named, Specification for Definition and Measurement of equipment Reliability, Availability, and Maintainability includes total time lost (downtime) due to module replacement and non-productive manufacturing standby time that includes halogen gas refills. Applicants' assignee Cymer has committed considerable effort to ensuring a positive trend to the light source availability is maintained. To date, interrupting the scanner operation to allow for full halogen gas replenishment of the light source has been an unavoidable necessity. However according to aspects of an embodiment of the disclosed subject matter, applicants propose better gas control algorithms, whereby fewer full halogen gas replenishments (replacements), which require the laser to stop discharging, may be needed, leading to appreciable gains in productive time.

Applicants' assignee Cymer's XLA and 7000 series lasers employ one or more halogen gas filled chambers as the gain medium. As the light source operates, the halogen gas is depleted and contaminants accumulate, so the gas must be periodically replenished.

The halogen gas may consist of either Argon (Ar) or Krypton (Kr) depending on the desired laser wavelength, along with, e.g., Neon (Ne) and also Fluorine ($F_2$). As the light source discharges energy across its electrodes to generate Deep Ultra-Violet (DUV) light, some of the fluorine atoms may be temporarily disassociated and temporarily form dimers of ArF or KrF. They may then recombine with other compounds (e.g. metals) inside the light source chamber and possibly form solid particles that accumulate as debris within the chamber. This debris can have two negative effects: (1) reduction of the amount of fluorine available for use as a dielectric between the electrodes and (2) acting as a contaminant decreasing the light source efficiency. Other contaminants may also be present in the chamber gas including carbon compounds, atmospheric gases, and combinations of these molecules with fluorine. These compounds can manifest over time causing a decrease in the laser efficiency seen, e.g., as an increase in discharge voltage required to create a constant pulse energy. The discharge voltage has an upper limit and so action must be taken remove contaminants and replenish the lost fluorine, typically in the form of a full gas replenishment (refill).

The need for refills, as discussed previously, requires the light source to stop discharging light. When this happens, the lithographic process must be halted in a controlled manner to prevent reworking of the in-process wafers. This control is achieved by coordinating refills with the scanner. However, the need for a refill can depend on several complex and often unpredictable variables (light source firing pattern, light source energy, age of light source modules, etc.). Therefore, coordination of refills with the scanner is done by a regular schedule, which ensures that the light source operation will never suffer unanticipated interruption due to the light source reaching some operational limit. This schedule often yields very conservative upper limits on the time between refills. That is, if some users of the light source operate at low pulse usages, the actual time between a required refill could be much greater than the simple schedule permits. Applicants assignee has developed technology that more accurately predicts the need for a refill, to reduce this conservatism, and deliver longer gas lives on average.

Applicants propose certain improvements to certain aspects of the above referenced single chamber and multichamber laser gas control systems.

SUMMARY

A method and apparatus are disclosed which may comprise predicting the gas lifetime for a gas discharge laser light source for a photolithography process, the light source comprising a halogen containing lasing gas, which predicting may comprise: utilizing at least one of a plurality of laser operating input and/or output parameters; utilizing a set of at least one parameter of utilization in the photolithography process to determine a gas use model in relation to the respective input or output parameter; predicting the end of gas life based upon the model and a measurement of the respective input or output parameter. The parameter may comprise a pulse utilization pattern. The method and apparatus may comprise performing gas management for a gas discharge laser light source for a photolithography process, the light source comprising a halogen containing lasing gas, which method and apparatus may comprise: utilizing periodic and frequent partial gas refills comprising an inject comprising a mixture of halogen gas and bulk gas in generally the same ratio as the premix ratio provided to the laser in a full gas refill, and in an amount less than two percent of the total gas pressure prior to the injection. The apparatus and method may comprise a predicting means for predicting the gas lifetime for a gas discharge laser light source for a photolithography process, the light source comprising a halogen containing lasing gas, which predicting may comprise: a means utilizing at least one of a plurality of laser operating input and/or output parameters; a means utilizing a set of at least one parameter of utilization in the photolithography process to determine a gas use model in relation to the respective input or output parameter; predicting the end of gas life based upon the model and a measurement of the respective input or output parameter. The apparatus and method may comprise a pulsed line narrowed gas discharge laser lithography light source comprising: a laser chamber containing a lasing medium gas comprising a halogen; a gas replenishment system comprising a controller executing a replenishment scheme comprising performing an inject at the time of the occurrence of an inject opportunity of a replenishing amount of the halogen along with a flushing amount of bulk gas. The halogen may comprise fluorine. The flushing amount may be sufficient to enable removal of a significant amount of contaminants from the lasing medium gas when the control system reduces pressure within the chamber to a level approximating the pressure within the chamber prior to the inject. The flushing amount enables the maintenance of generally a refill percentage of constituents of the lasing gas medium over extended time periods. The controller executing the replenishment scheme at inject opportunities occurring a regular intervals determined by factors comprising one or both of elapsed time and shot count. The replenishment scheme comprising performing an inject of a flushing amount of bulk gas without any halogen. The replenishment scheme may comprise performing an inject of a flushing amount of bulk gas without any halogen at selected instances of the inject opportunities. The gas controller may modify the selected replenishing amount according to an estimation of actual fluorine consumption in the chamber. The estimation of actual fluorine consumption may be based upon a measurement of a laser system input or output operating parameter that varies in a known way with a change in fluorine content in the lasing medium gas. The method and apparatus may comprise controlling gas replenishment in a pulsed line narrowed gas discharge laser lithography light source into a laser chamber containing a lasing medium gas comprising a halogen utilizing a method which may comprise in response to long term modifications in laser input/output operating parameter values adjusting one or more members of a subset derived from a set of measured laser operating system parameters to adjust laser efficiency by steps which may comprise: maximizing the time or shot accumulation before one or more of such operating parameter values exceeds an operational or user-chosen boundary condition, minimizing a subset, $S_1$, of such operating parameters in combination with maximization of a subset, $S_2$, of such parameters. The method and apparatus may comprise weighting and/or normalizing the subset members to assign an order of importance to the respective subset members. The subset $S_1$ or $S_2$ may comprise an empty set. The apparatus and method may comprise minimizing a norm value or other norm between a subset of parameters, $S_3$, and may comprise minimizing a norm value or other norm between a subset of parameters, $S_3$, and may comprise subjecting the maximizing or minimizing to soft constraint and/or a hard constraint.

BRIEF DESCRIPTION OF THE DRAWINGS

FIG. 1 illustrates by way of example a schematic and block diagram form of a laser gas controller, according to aspects of an embodiment of the disclosed subject matter;

FIG. 2 illustrates a schematic and block diagram form of an open loop injection controller, according to aspects of an embodiment of the disclosed subject matter;

Figure 8:
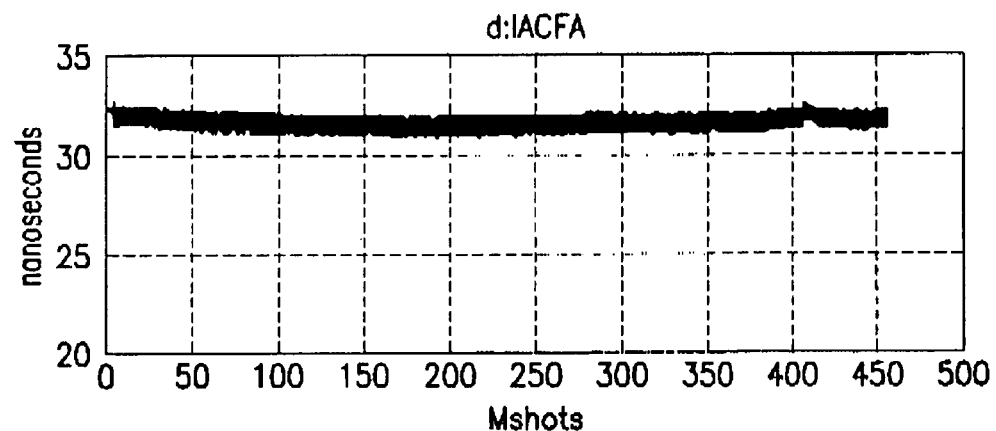
Figure 9:
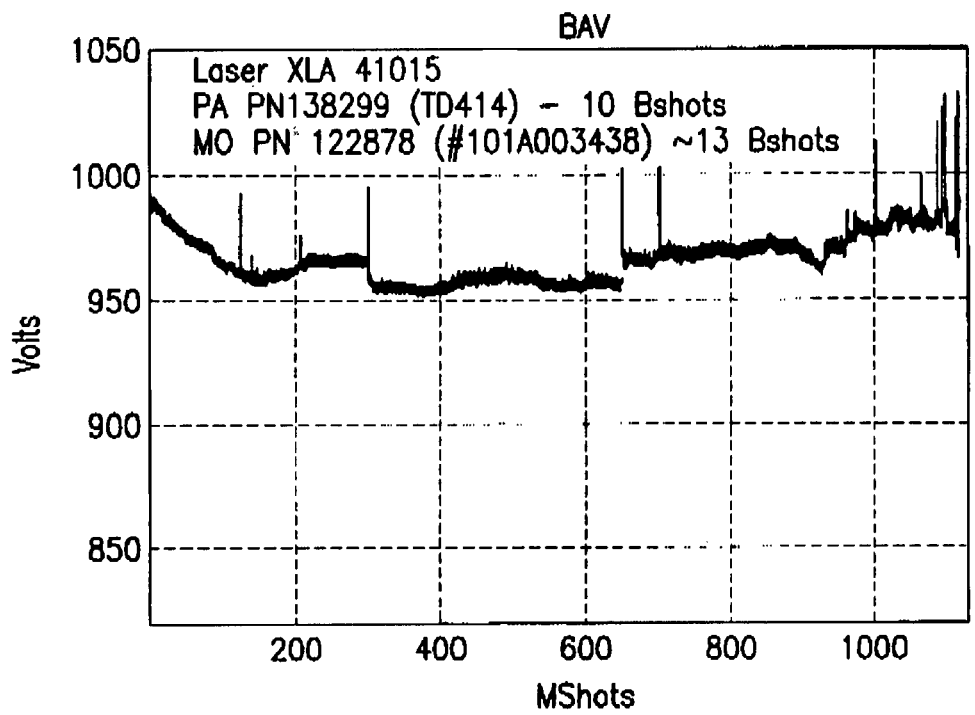
Figure 10A:
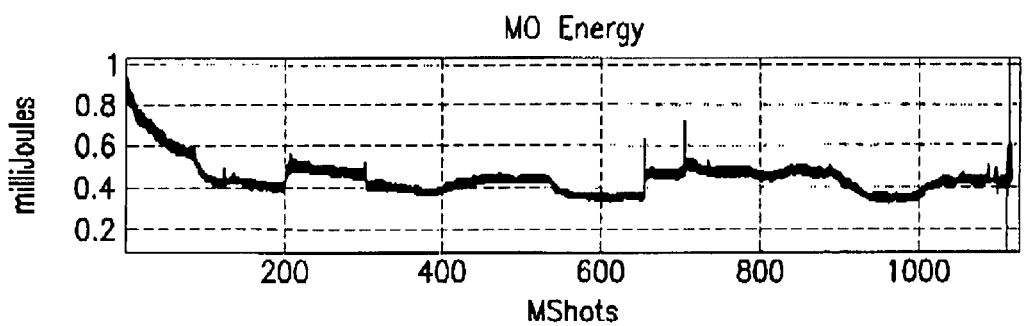
Figure 10B:
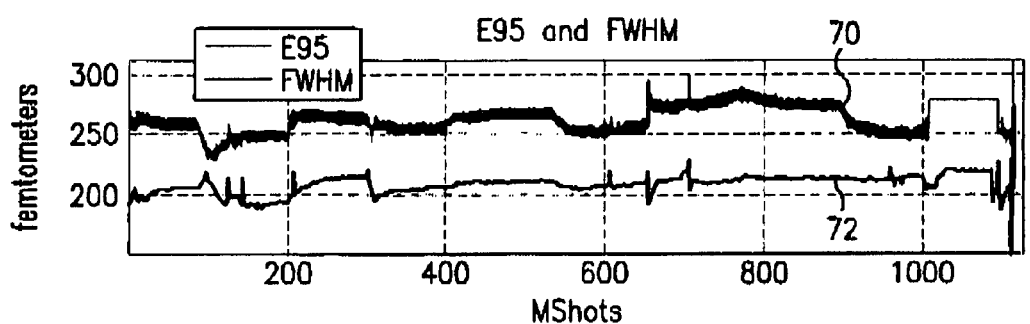
Figure 10C:
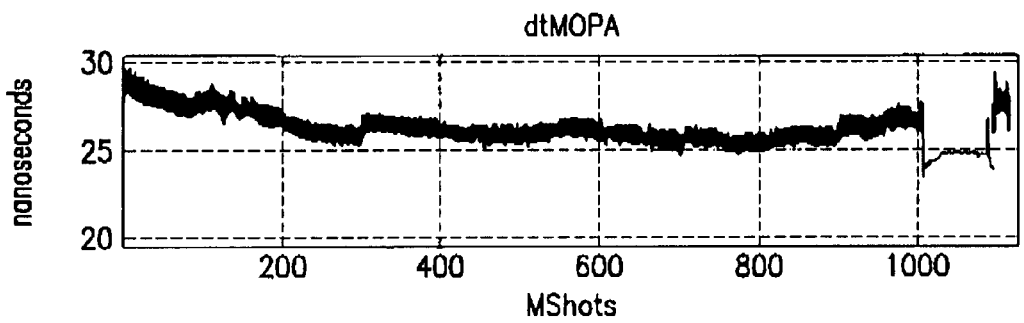
Figure 11A:
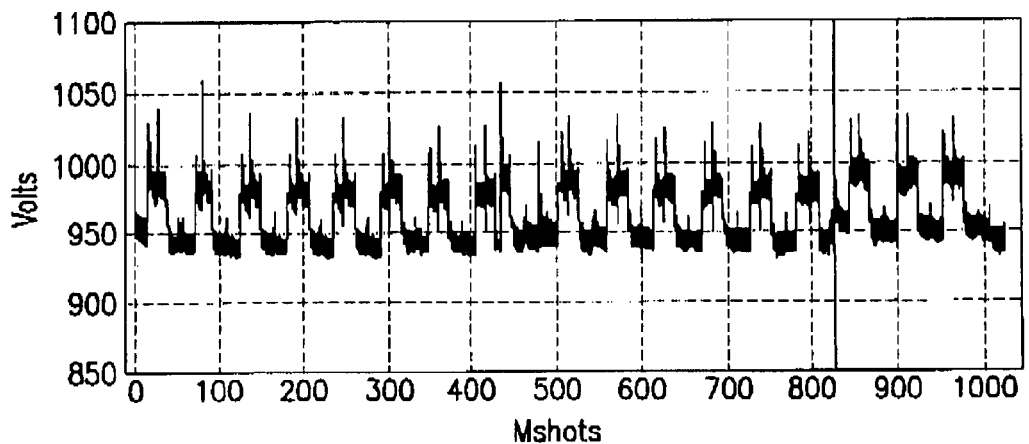
Figure 13:
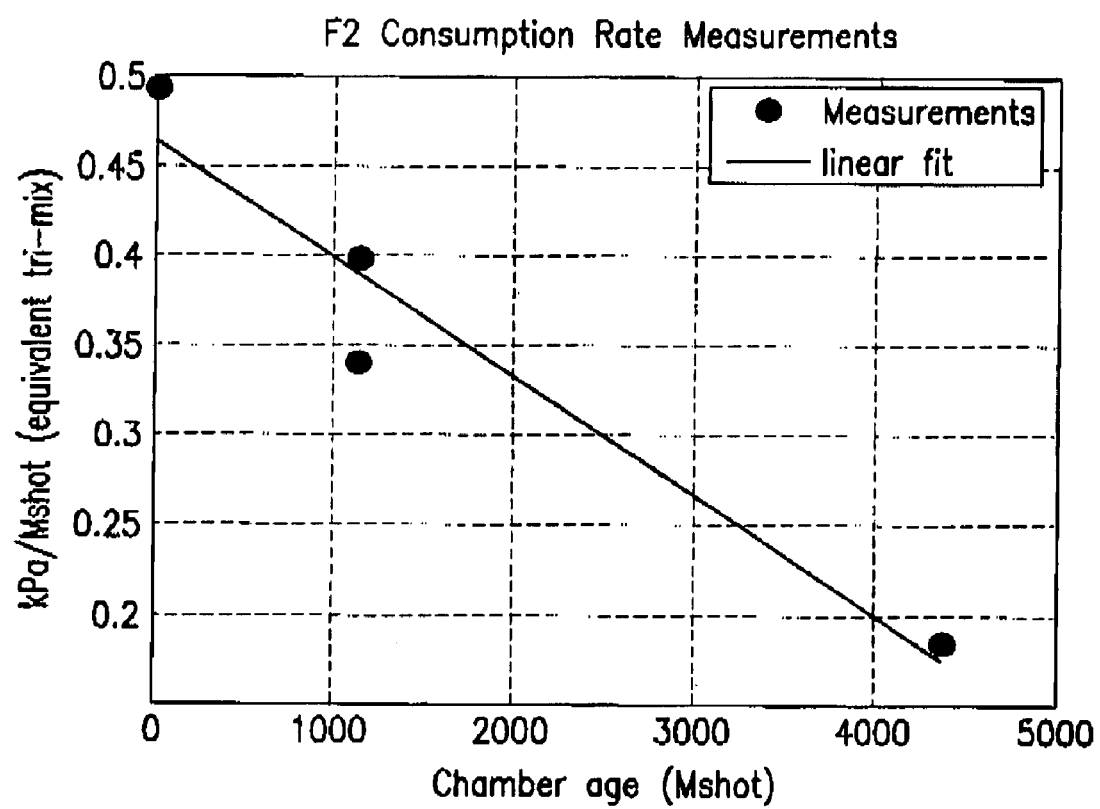
Figure 14:
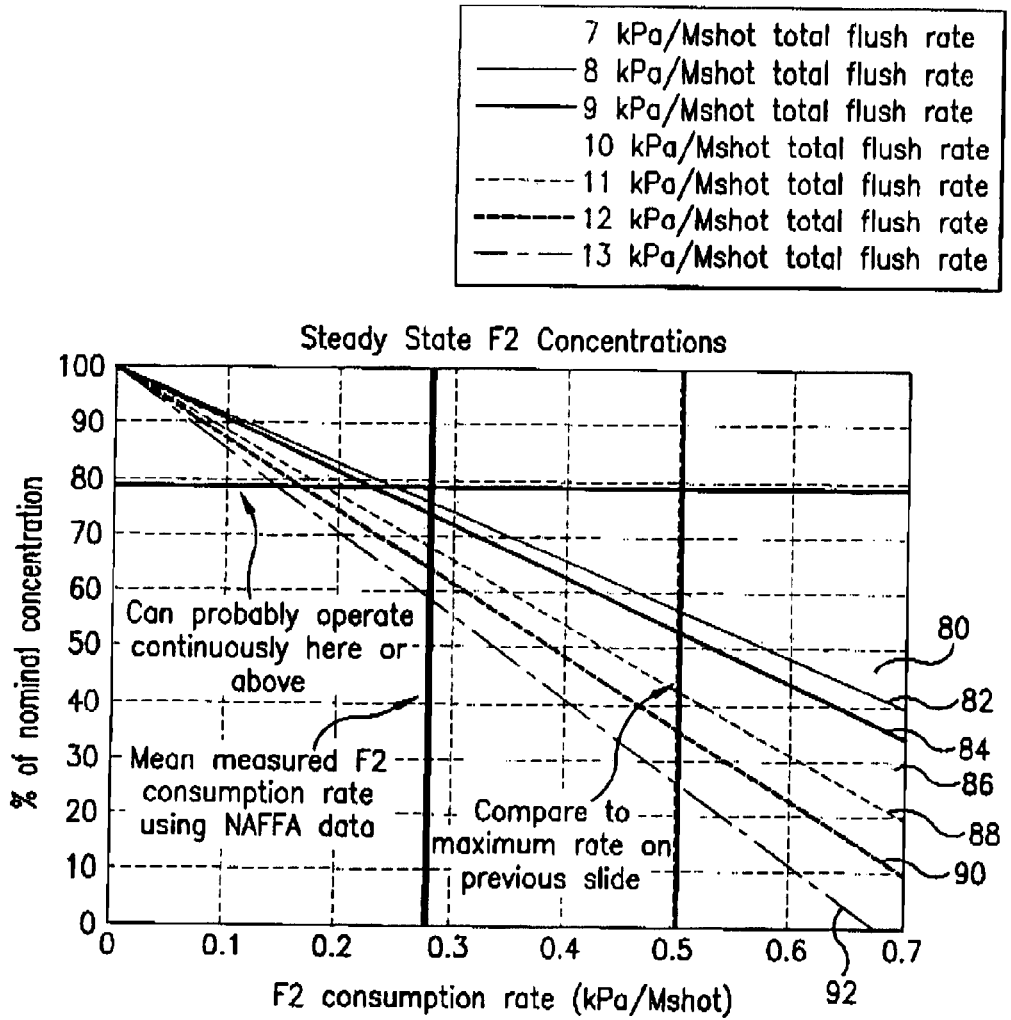
Figure 15:
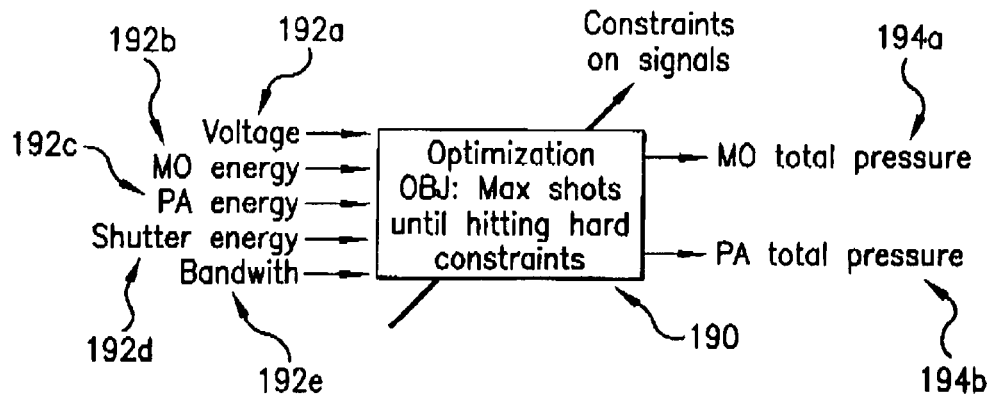
Figure 16:
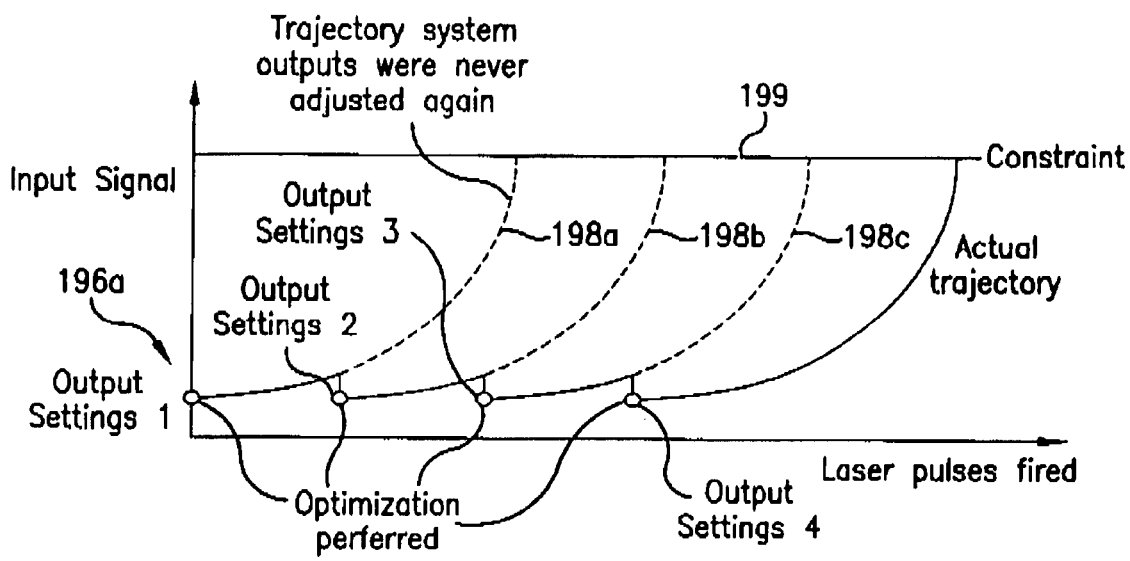
Figure 17:
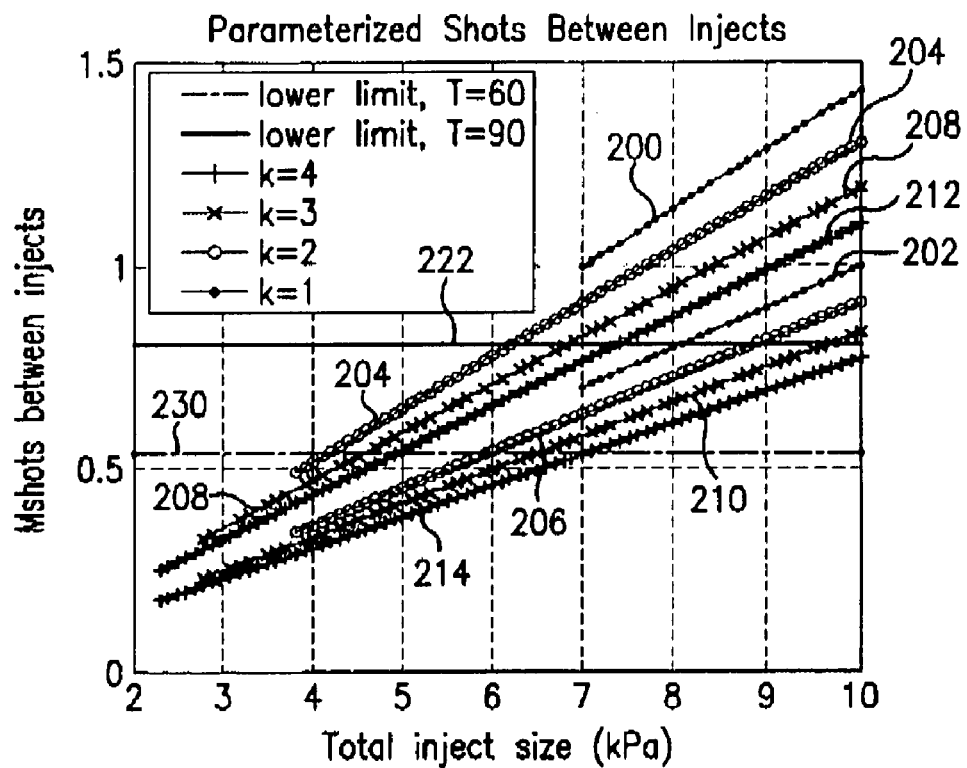
Figure 18:
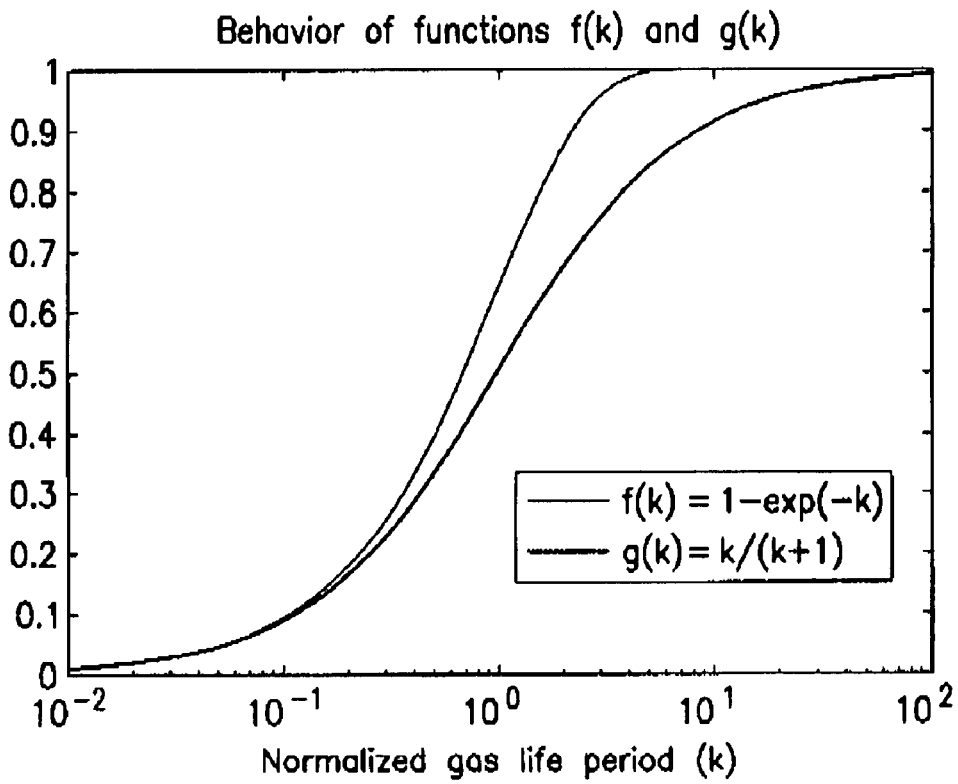
Figure 19A:
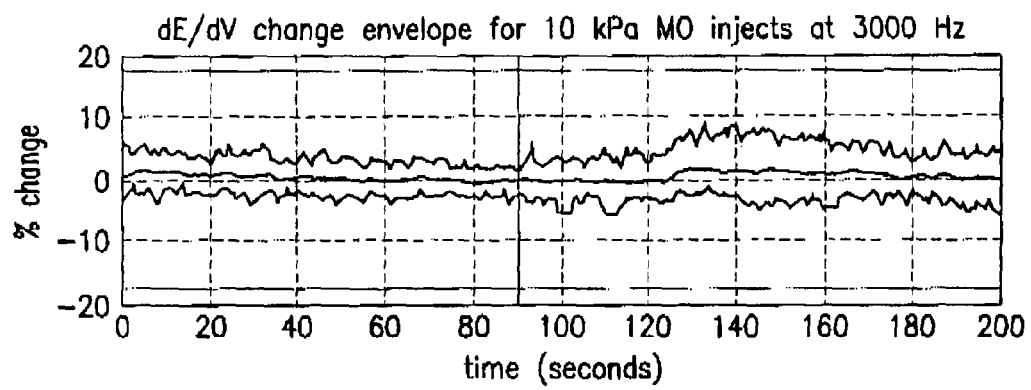
Figure 19B:
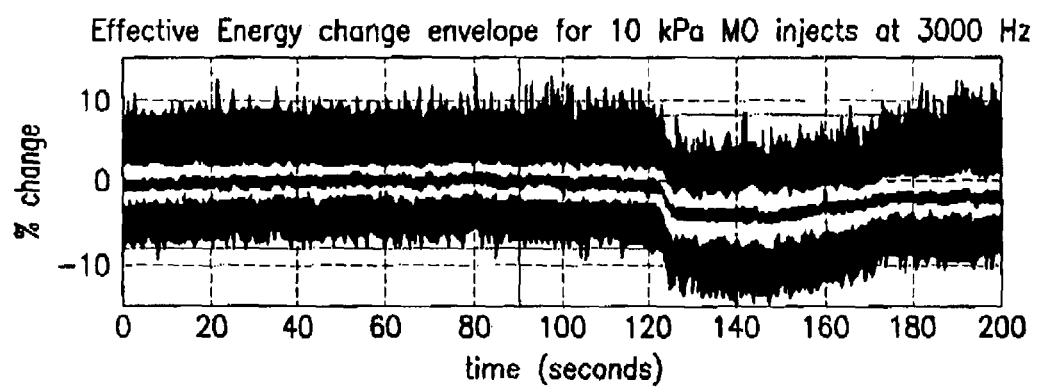
Figure 19C:
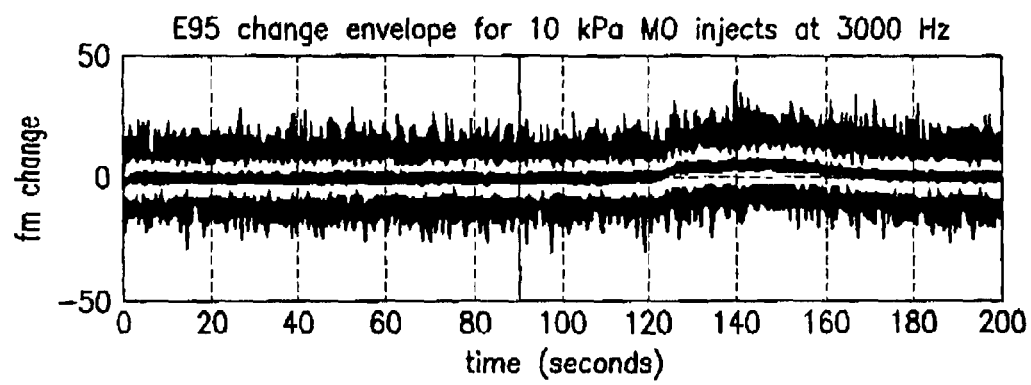
Figure 20A:
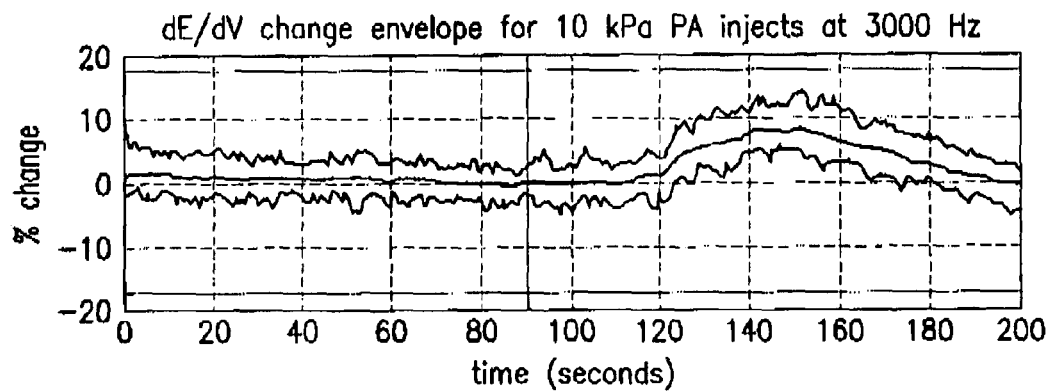
Figure 20B:
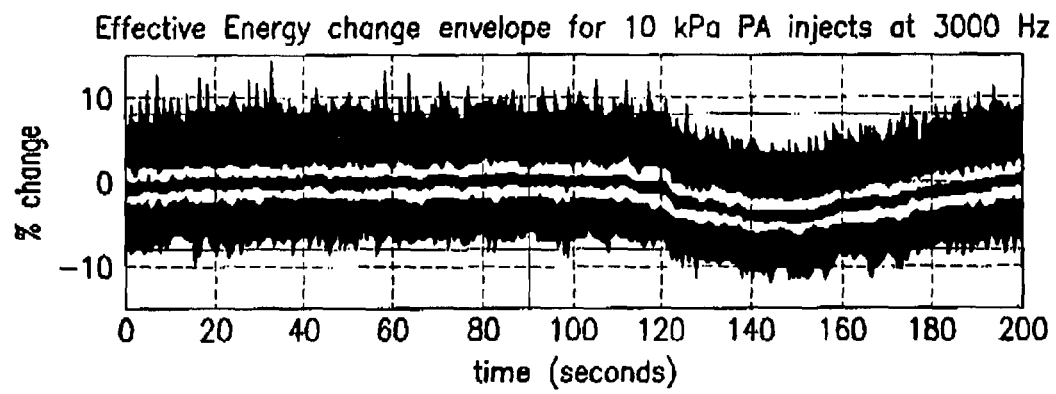
Figure 20C:
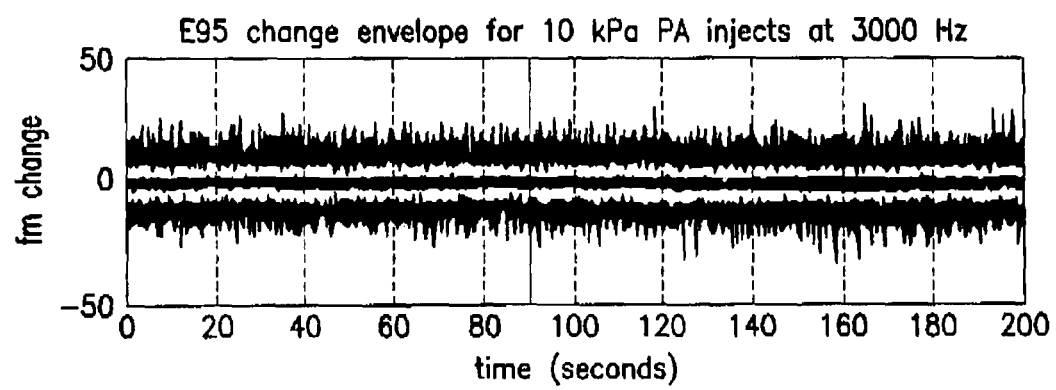
Figure 21A:
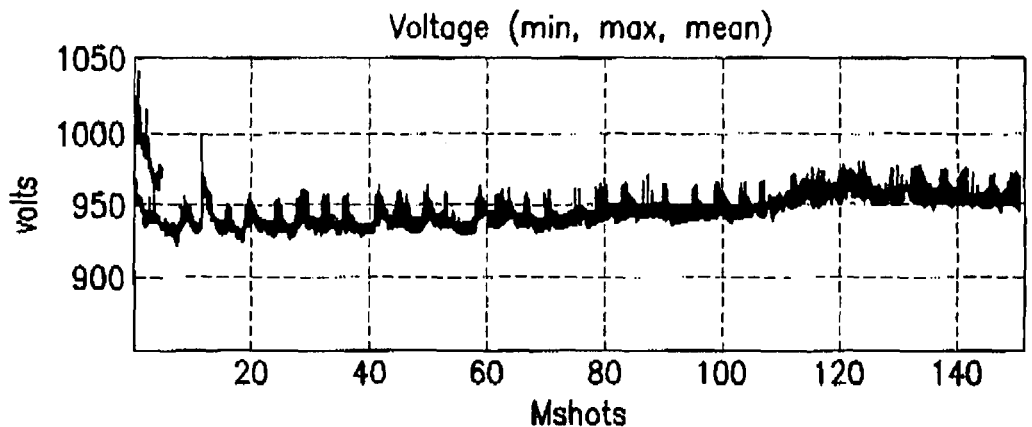
Figure 21B:
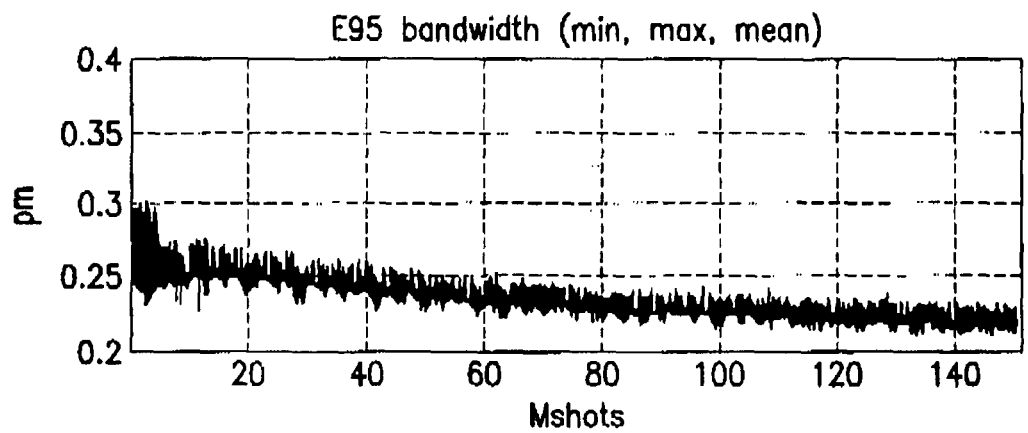
Figure 21C:
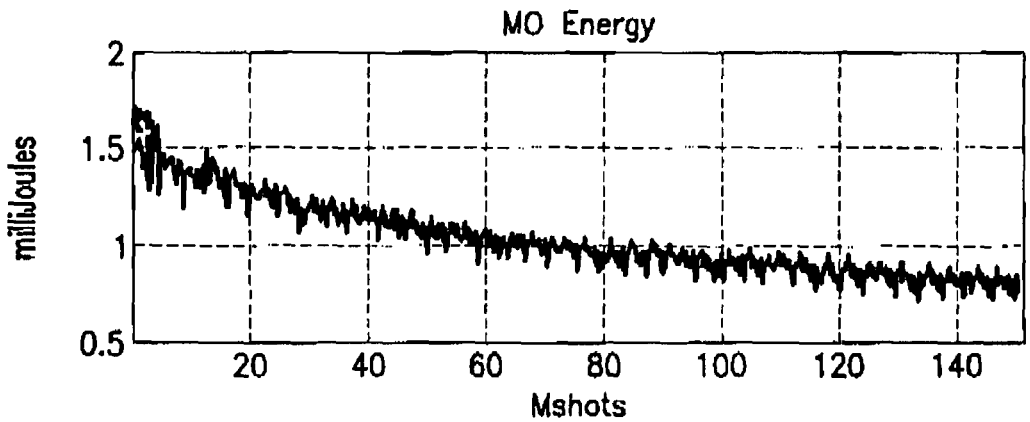
Figure 22:
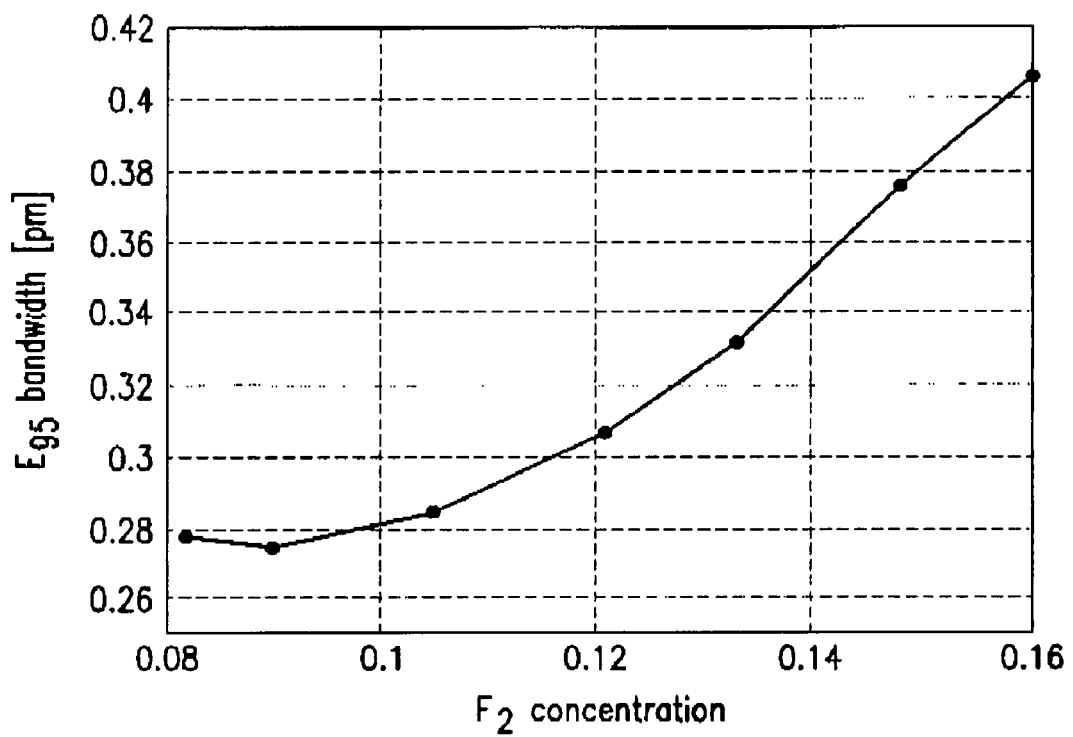
Figure 23:
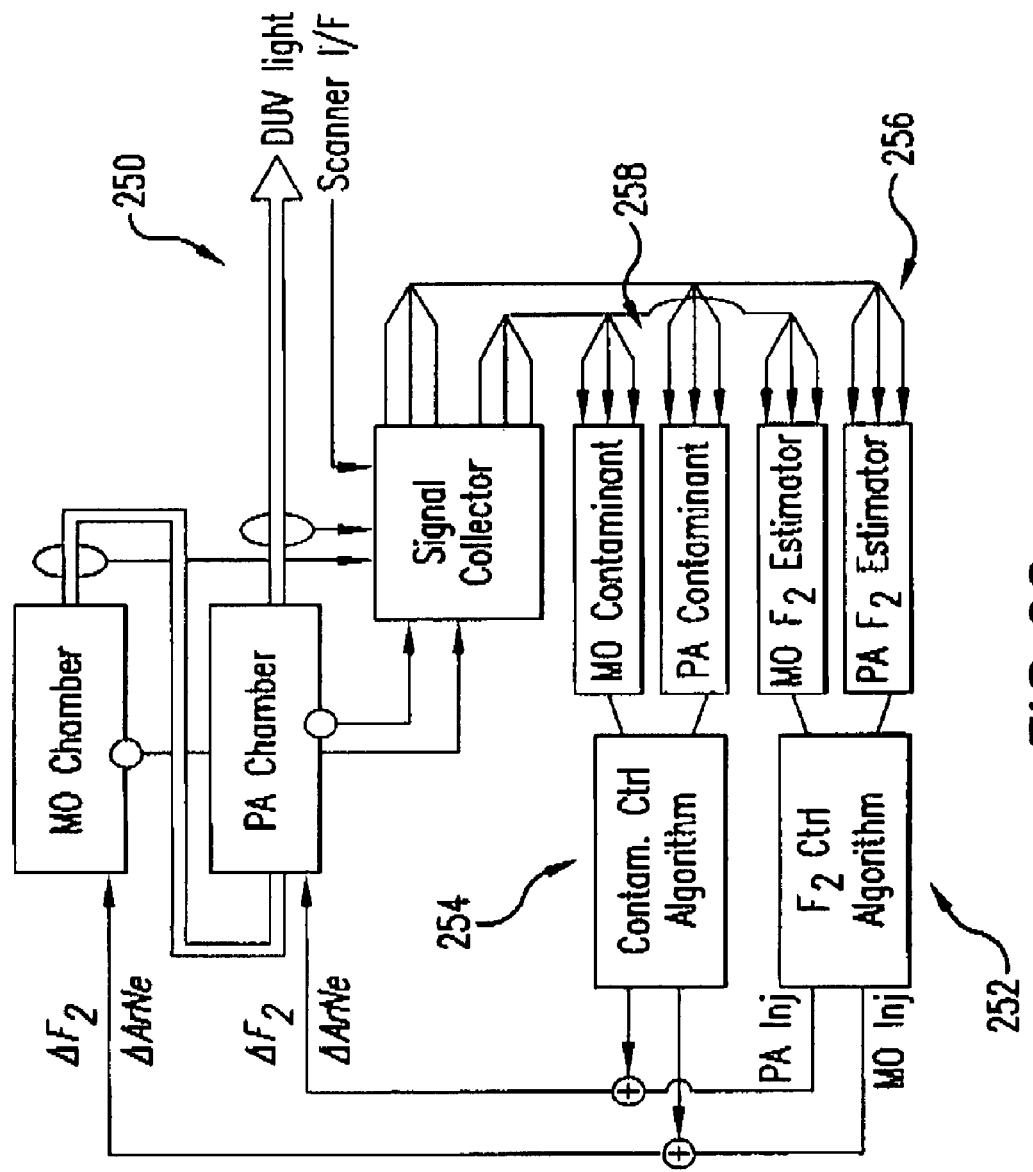
Figure 24:
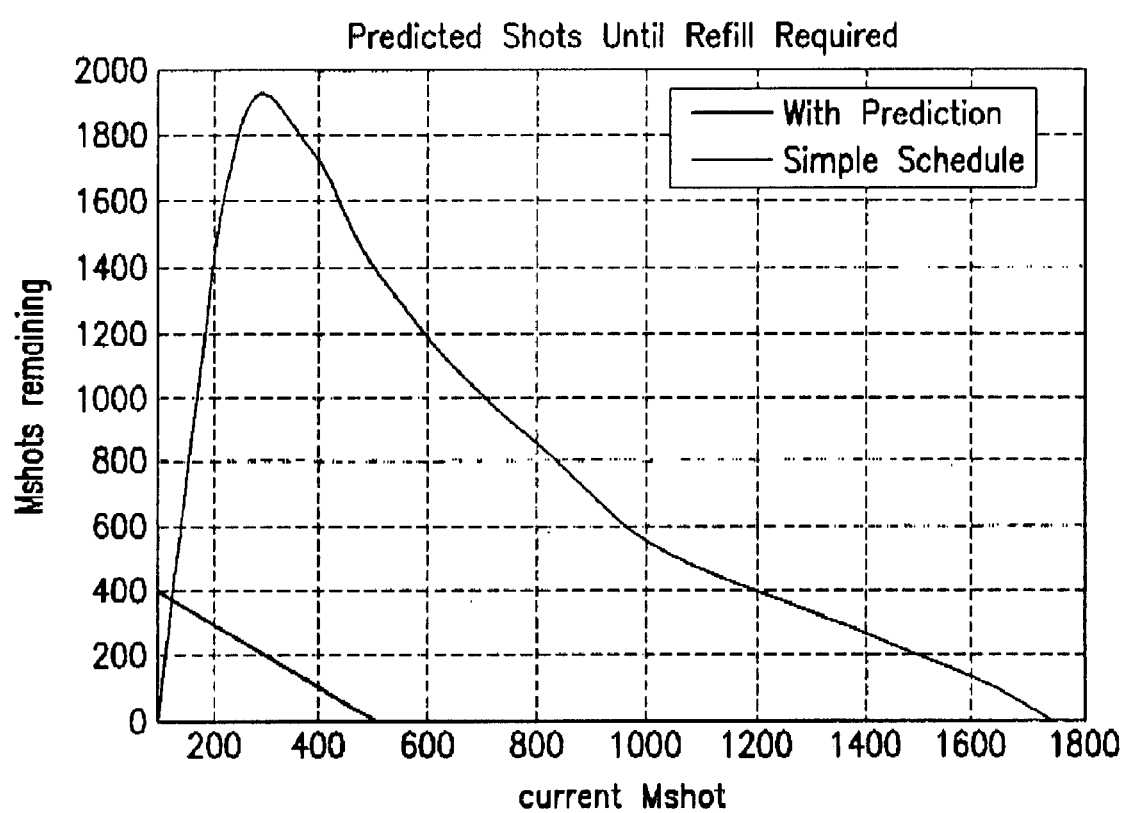

FIG, 7 illustrates performance with a multi-chamber laser gas control system, relating to bandwidth measurements, e.g., variation in E95% 70 and FWHM 72 in femtometers, according to aspects of an embodiment of the disclosed subject matter;

FIG. 8 illustrates performance with a multi-chamber laser gas control system, relating to dtMOPA according to aspects of an embodiment of the disclosed subject matter;

FIG. 9 illustrates a test of the ability to maintain charging voltage in a MOPA system according to aspects of an embodiment of the disclosed subject matter;

FIGS. 10A-C illustrate other measurements during the same test run, according to aspects of an embodiment of the disclosed subject matter;

FIGS. 11A and B illustrate measurements of voltage and dE/dV for the same test run, according to aspects of an embodiment of the disclosed subject matter;

FIGS. 12 A-C illustrate measurements of Mo energy, bandwidth and dt MOPA according to aspects of an embodiment of the disclosed subject matter;

FIG. 13 illustrates $F_2$ consumption variation, according to aspects of an embodiment of the disclosed subject matter;

FIG. 14 illustrates flush rates, according to aspects of an embodiment of the disclosed subject matter;

FIG. 15 illustrates by way of example optimization algorithm according to aspects of an embodiment of the disclosed subject matter;

FIG. 16 illustrates aspects of an embodiment of the disclosed subject matter, such as how optimization can be used to, e.g., maximize operational lifespan;

FIG. 17 shows an exemplary plot of constant flushing inject constraints according to aspects of an embodiment of the disclosed subject matter;

FIG. 18 represents the behavior of the solutions to certain equations according to aspects of an embodiment of the disclosed subject matter;

FIGS. 19A-C illustrates changes in dF/dV, effective output energy and e95 bandwidth for approximately 10 kPa injects into the MO, according to aspects of an embodiment of the disclosed subject matter;

FIGS. 20A-C the effects of similar injects into the PA according to aspects of an embodiment of the disclosed subject matter;

FIGS. 21A-C illustrates that the overall voltage, bandwidth, and energies during an experiment, according to aspects of an embodiment of the disclosed subject matter;

FIG. 22 illustrates a change in bandwidth with changes in $F_2$ concentration, according to aspects of an embodiment of the disclosed subject matter;

FIG. 23 illustrates a schematic and block diagram form of a gas controller, according to aspects of an embodiment of the disclosed subject matter;

FIG. 24 illustrates a prediction of shots until a refill is required, according to aspects of an embodiment of the disclosed subject matter.

DETAILED DESCRIPTION OF PREFERRED EMBODIMENT(S)

Chamber gas refills have been a necessary part of DUV photolithography laser light sources, in order to, e.g., remove contaminants, replenish fluorine (F2), and generally "reset" the gas to a known state. Without such refills, laser firing voltage to maintain constant energy tends to increase to saturation, i.e., above some desired upper limit. After a refill, the voltage drops significantly, and the cycle repeats. The aging of laser modules will also increase required voltage. Refills cannot correct for this effect, but the effect occurs over a much longer time scale than the gas-based phenomenon. Refills for ArF lasers have typically been required as often as once every 100 MShots, with KrF lasers being less demanding of frequent refills. Since each refill typically requires about 18 minutes to complete, the down time for the laser is about 7.5 minutes per day for refills. During refills, the laser is not operating as a light source and, e.g., the photolithography process must cease. Eliminating the downtime due to refills would give 0.5% improvement in throughput per photolithography scanner system. Assuming that a DRAM wafer layer takes about 1 minute to expose this amounts to potentially 210 more wafer layers per day from the a manufacturer utilizing, e.g., about 25-30 scanners with associated DUV narrow band excimer laser light sources. According to aspects of an embodiment of the disclosed subject matter, refills may be eliminated and also injection time may be shortened adding further throughput improvements. Combining throughput improvements due to injects and refill elimination according to aspects of an embodiment of the disclosed subject matter could yield a 1% improvement in laser throughput, and potentially ~400 more wafer layers per day, or around 16 wafers (assuming 25 layers/DRAM).

According to aspects of an embodiment of the disclosed subject matter a proposed gas control algorithm can result in elimination of the need for refills. For example, such an algorithm may perform very frequent gas injects and bleeds. The injects may include typical $F_2$ amounts as have been employed in prior algorithms, however, a much larger rare buffer gas (Neon) amount may also be injected, defined herein as a flushing amount. A bleed can then return the chamber to initial pressure. Such a large inject of buffer gas (and perhaps also including rare gas (e.g., Kr or Ar, respectively for KrF or ArF, collectively "bulk gas")) can, e.g., tend to "flush" the gas more than current injection algorithms, thereby maintaining a perpetual and functional gas state. The flushing of the gas tends to remove contaminants and maintain F2 concentrations to levels that allow the laser to continue to fire forever, i.e., at or near the pre-mix ratio.

According to aspects of an embodiment of the disclosed subject matter, e.g., for multi-chamber laser systems, such as applicants' assignee's XLA laser systems, each chamber (the master oscillator chamber and the amplification medium chamber) may be injected with between 0 and 1.5 kPa of $F_2$ and between 5.0 and 7.0 kPa of an appropriate mixture of Ar and Ne every "injection opportunity." Such injection opportunities may occur periodically in time of shot count, e.g., every X million shots ("XMshot"), e.g., the injection opportunities can be alternating 500K shots, i.e., 1 M shots per chamber, alternating chambers. According to a possible preferred embodiment some minimum level of fluorine injection can be made on every injection, i.e., the fluorine level will not be set to 0. This can essentially be repeated for single chamber lasers, i.e., an injection opportunity every selected number of shots (or time period), e.g., 500 Kshots or 1 Mshots in the chamber, with the injection of fluorine set to between 0 and 1.5 kPa, preferably not zero. The selection of which mode to operate in, zero $F_2$ or some minimum fixed $F_2$, may, e.g., be set at the factory (or upon installation) and essentially not changed thereafter, or maybe changed after some time to the other mode. In addition, the amount of fluorine or the ratio of fluorine to buffer gas or buffer and rare gas mixture (collectively "bulk gas") may change over time of laser operation, e.g., by field maintenance, and the total amount of the inject may be also reset, e.g., from 7.9 kPa. That is to say, at some point in time the ratio of $F_2$ to other gas(es) may be changed from 1:6.9 to, e.g., 2:6.9 or 4:6.9. etc. or the overall injection may be changed to, e.g., 9.0 kPa, e.g., with the $F_2$ to other gas(es) changed to 1:8. Further, it is also possible that over time the total amount may be reduced, e.g., to 6 kPa and amounts of the $F_2$ and other gas(es) similarly adjusted. This is injected into a laser including about 3 kPa of $F_2$ and 300 kPa total gas pressure prior to the inject. The gas injection controller has nothing to do with this selection during the actual operation of the laser, i.e., it simply executes the injects as preselected or the pattern of injects, e.g., some with F2 and some without, as preselected for a relatively long time of gas life until the mixture and/or pattern is reselected, or until gas life expires.

Those skilled in the art will understand that these numbers are exemplary only as are the possible changes mentioned for the algorithm's operation over the time of the laser operation. They may vary from laser system to laser system depending on such things as "typical" operating parameters controlled by the end user, e.g., duty cycle (meaning for purposes of this application the ratio of the time the laser is on to the time the laser is off, either due to normal times to transfer the scanner from die to die or wafer to wafer or in between wafers or other "off" time, while the laser is generally still in operation supplying light to, e.g., a scanner, and not including such time as maintenance on the scanner and the like, for the typical use in a photolithography semiconductor processing scanner, and also one or more factors relating to the operation of the laser itself, such as chamber size and material(s) composition, electrode erosion, voltage, total gas pressure, gas control system capabilities, e.g., regarding selecting the appropriate amounts of gas and delivering them to the laser chamber within some minimum time, interference with the operation of the laser, e.g., dE/dV, pulse energy stability and the like due to the size of the inject and/or the size of the fluorine content in the inject.

As an example, it has been shown that some laser chambers reduce the rate of gas contamination over the lifetime of operation of the laser, which would mitigate toward a reduction in flushing, i.e., a reduction in the total gas injection, e.g., below the above noted exemplary 7.9 kPa at the initiation of laser operating life, e.g., reducing the bulk gas content, and perhaps while also increasing the $F_2$ in the injection due, e.g., to an increase in $F_2$ consumption over time, e.g., due to increases in electrode erosion over the life of the laser operation.

Furthermore it will be understood that this desired "flushing" can be accomplished with a system that, e.g., injects fluorine only on some of the periodic injects and only the other gas(es) ("bulk gas(es)") on the other injects, e.g., using the exemplary numbers noted above, on, e.g., every fourth inject the ratio of $F_2$ to the other gas(es) can be 1:6.9 and for the other three injects the ratio can be 0:6.9, which would inject fluorine at 1/4 the rate noted above, or the injection of $F_2$ every, e.g., fourth injection opportunity, could be at the ratio of 4:6.9, which would inject $F_2$ overall at the same rate as noted above. This could be done alternating from chamber to chamber in a multi-chamber system, i.e., every selected number of injection opportunities in the first chamber and every selected number of injection opportunities in the second chamber, wherein the selected numbers may be equal or not.

This could also be a mode that is shifted to later in the laser operation life for reasons including those noted above. Similarly, the rare gas, e.g., Ar or Kr could be included in the inject mixture in less than all of the injects, and still accomplish the goal of getting the desired periodic and repeated frequent flushing of contaminants from the laser chamber, by way of the bleed down of the relatively large amount of other gas(es) injected in those injects that do contain bulk gases and still maintaining the gas mixture in the chamber at close to the initial pre-mix for the initial fill of the gas, e.g., at about 0.1% $F_2$, 1.0% Ar and 98.9% Ne for an exemplary ArF laser produced by applicants' assignee.

In short, the algorithm at selected times in the overall operational life of the laser system (single chamber or multi-chamber) selects an inject amount to periodically inject into the laser chamber fluorine at a selected replenishment amount along with at least a quantity of buffer gas large enough to flush significant amounts of gas containing contaminants from the laser chamber with the resultant bleed down to a selected overall gas pressure in the chamber, while maintaining the gas mixture in the laser chamber at or near the selected pre-mix gas ratio (selected with the intention of optimizing laser operation to the degree possible by such selection) and also while not significantly interfering with maintaining key laser operating parameters, such as pulse energy, pulse energy stability, bandwidth, bandwidth stability, dose, dose stability and the like within the required specifications, e.g., for operation of the laser system as a laser light source for semiconductor manufacturing photolithography processes.

According to aspects of an embodiment of the disclosed subject matter, on top of this algorithm employing open loop periodic injections, the gas control system may also modify the selected amount of a gas being injected, e.g., $F_2$ according to some feedback regarding the status of one or more laser input operating parameters, e.g., charging voltage or the difference in the timing of the discharge in the seed laser and amplifying laser (herein "dtMOPA" as a shorthand, though not limited to amplifier laser sections that a power amplifiers, i.e., PA's) and/or laser output operating parameters, e.g., bandwidth, e.g., particularly, e.g., E95% (the width of the integral containing from 2/5% to 97.5% of the integral of the energy within the intensity curve of the laser output) or energy output, e.g., from the seed laser portion, herein "$E_{MO}$" as a shorthand, though not limited to a seed laser portion that is an excimer master oscillator, e.g., in applicants' assignee's XLA series MOPA laser systems. For multi-chamber laser systems an example of such a gas control algorithm is referred to as "NAFFA," aspects of which are described in one or more of the above referenced patents and pending applications, and for a single chamber laser systems such an algorithm is referred to by applicants' assignee as AFI (1 or 2) aspects of which are described in one or more of the above referenced patents or pending applications, and aspects of each of which as applicable to the current system will be described below.

NAFFA and AFI (1 or 2) according to aspects of an embodiment of the disclosed subject matter may, e.g., use a variety of values of laser input and/or output operating parameters, e.g., normalized for certain aspects of laser operation, e.g., duty cycle and the like, rather than the actual values of such parameters, to determine an estimated consumption of fluorine in the single chamber laser or in the respective seed laser portion, e.g., an MO and amplifier laser portion, e.g., a PA for a multi-chamber laser system.

For NAFFA, according to aspects of an embodiment of the disclosed subject matter, based on the sum of two weighted (including zero weighting) estimates of fluorine content, determined by comparing the normalized parameter value to a reference value, an estimate is made of consumption fluorine in, e.g., an MO and a PA. The estimated consumption is based on previously determined relationships of the respective laser operating parameter values from a reference value to change in fluorine content. For example the sum of estimated consumption based on change in dtMOPA and BW may be used to estimate the seed laser portion, e.g., an MO, consumption and the sum of estimated consumption based on change in voltage and $E_{MO}$ may be used to estimate the amplifier laser portion, e.g., a PA consumption. When the respective chamber experiences an injection opportunity (which may, e.g., alternate from chamber to chamber in the exemplary multi-chamber laser system), and if the respective estimate is above a selected minimum injection amount, then the system will make in inject into the respective chamber. When NAFFA is running on top of the above discussed open loop injection algorithm, depending on the amount of $F_2$ injection selected for the particular injection opportunity, there may or may not be an injection of $F_2$. For example, in the mode noted above where $F_2$ is not injected into the respective chamber at the particular injection opportunity, or where the pre-selected $F_2$ injection ratio is 0 for all injection opportunities, then whether an injection of $F_2$ occurs would depend, e.g., on the amount indicated by the NAFFA algorithm for $F_2$ injection equaling or exceeding the minimum injection amount, e.g., required by the gas control system to accurately inject such an amount. If that is not the case, then no $F_2$ injection would occur for the respective injection opportunity for the respective chamber. Of course it is contemplated that the selected injection amount for $F_2$ under the open loop portion of the algorithm, e.g., 1 kPa, is selected to be above the required inject minimum.

NAFFA according to aspects of an embodiment of the disclosed subject matter may, e.g., for an exemplary multi-chamber laser system, e.g., a MOPA or MOPO two chamber laser system, may estimate an amount of fluorine consumed in the MO ($\hat{F}_2^{MO}$) and in the PA/PO ($\hat{F}_2^{PA}$) according to the formulas:

$$\alpha_1(dtMOPA - dtMOPA_{REF}) + \alpha_2(E95 - E95_{REF}) = \hat{F}_2^{MO}$$
where $\alpha_1 + \alpha_2 = 1$ \hfill Eq. $A_1$; and $$\alpha_3(E_{MO} - E_{MO\,REF}) + \alpha_4(V - V_{REF}) = \hat{F}_2^{PA}$$ where
$\alpha_3 + \alpha_4 = 1$ \hfill Eq. $A_2$.

dtMOPA represents the difference between the time that the electrical discharge occurs between the electrodes in the seed laser chamber (e.g., an MO chamber) and between the electrodes in the amplifier laser (e.g., a PA/PO chamber). $E_{MO}$ is the pulse energy output of the MO chamber. E95 is the 95% integral measure of the bandwidth output of the exemplary MOPA laser system. V is the voltage across the electrodes (nominally maintained the same for each chamber). In the actual algorithm, the values of dtMOPA, E95, $E_{MO}$ and V may be normalized for another laser system operational parameter(s), e.g., for duty cycle and/or laser system output energy, as noted below in the AFI discussion.

The estimated amount of fluorine consumed in the MO ($\hat{F}_2^{MO}$) is thus based in part on an empirically determined amount of fluorine consumption for a given change in dtMOPA from some reference. The reference point ($dtMOPA_{REF}$) determines an operating point on a $\Delta dtMOPA/\Delta F_2$ curve. The same is true for E95 based upon a reference point $\Delta E95_{REF}$ on a $\Delta E95/\Delta F_2$ curve. E95, or some other measure of bandwidth, may be measured at the output of the amplifier laser portion, e.g., the PA. In some embodiments $\alpha_2$ may be set to zero. An estimated fluorine consumption in the amplifier laser portion, e.g., the exemplary PA power amplifier laser ($\hat{F}_2^{PA}$) can similarly be determined using normalized values for $E_{MO}$ and V and respective references.

According to aspects of an embodiment of the disclosed subject matter, for a single chamber laser system, under AFI, e.g., AFI2, injection may be made according to the equation:

$$\alpha_1(V_N - V_{REF}) * \frac{dV}{dF} + \alpha_2(E95_N - E95_{REF})\frac{dE95}{DF} = \hat{F}_2 \qquad \text{Eq. B}$$

There can also be used weighted normalized values of laser operating parameters, i.e., voltage and bandwidth multiplied by the change in the parameter value with fluorine content change, summed to estimate the fluorine content change. If the consumption estimate is above some minimum (which it will always be when the closed loop fluorine amount is set to a non-zero and presumably above minimum injection amount), the system will cause an inject at each injection opportunity.

After each inject, e.g., every million shots (alternating 500K shots for two chambered systems) the pressure is bled down to a selected amount. Thus the effect is to flush the respective chamber(s) very frequently to remove contaminants, while also replacing fluorine, to maintain the optimum gas mixture or close to it.

This combination of fixed injection open loop and closed loop adjustments is called GLX.

In addition, every selected number of pulses (e.g., determined empirically), or when the controller detects that voltage is drifting from a selected $V_{REF}$, the system can raise the pressure in the chamber(s). Such raises may continue from time to time, e.g., again dependent on maintaining a parameter, e.g., $V_{REF}$ until pressure reaches an upper limit. The system controller may then select another laser system input or output operating parameter, e.g., $V_{REF}$ and, may then also return to the original pressure. The system may continue to repeat this process, such that no refills are needed even over a life of tens of billions of shots. This change in pressure and voltage over chamber life is called by applicants' assignee Gas Optimization, i.e., GO for short.

The inject amounts are also selected to be large enough to do the flushing at periodic intervals, but also small enough not to significantly impact such parameters as dE/dV or energy per se by a single inject. Such control can, e.g., increase the availability of the laser, e.g., because the efficiency state of the laser is continually being kept optimal and robust, rather than waiting for manual intervention, e.g., in the form of a refill. Therefore, it also reduces the downtime associated with performing prior art forms of gas optimization. With the stabilization of the state of the excimer laser discharge gas for long periods, and the reduction or entire prevention of the need for full chamber gas replacement (a refill), the advantage is in reducing laser unavailability necessary for full gas replacement extended over may former gas lives, and perhaps even for the entire laser operating life time, as defined by other system components than laser gas composition, e.g., for a billion or even several billion shots.

Figure 3:
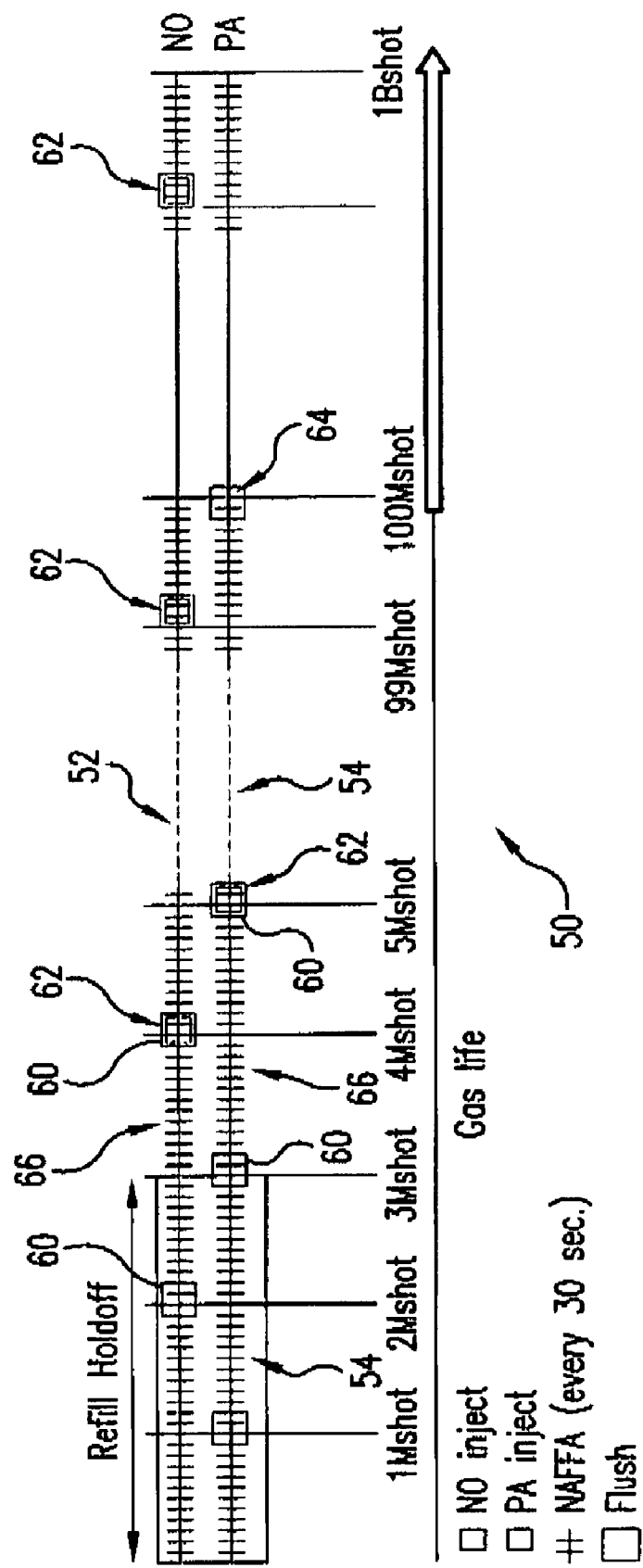
FIG. 3 illustrates a flushing refill schedule according to aspects of an embodiment of the disclosed subject matter.

Turning now to FIG. 3 there is illustrated a flushing refill schedule 50 according to aspects of an embodiment of the disclosed subject matter. The schedule 50 may be, e.g., for a multi-chamber laser system, e.g., a MOPA such as applicants' assignee's XLA MOPA series laser systems or an MOPO, such as applicants' assignees soon to be released XLR series laser systems, with a separate flushing schedule 52 for the, e.g., MO on the one hand and 54 for the, e.g., PA amplifying laser portion ion the other hand. Both the MO and PA flushing schedules 52, 54 could be blocked, e.g., by a refill holdoff 54, e.g., for a period of time or a number of shots, e.g., 3M shots, such that even though replenishment/flush opportunities 60 occur during this refill holdoff 54 no injects can occur. After this holdoff period flush opportunities 60 occur, e.g., alternating between the one chamber, i.e., the MO and the other chamber, i.e., the PA in the exemplary system, e.g., every 1M shots, i.e., an injection opportunity in each respective chamber every 2M shots.

In the meantime, under the control of, e.g., a feedback gas control system, e.g., NAFFA, injection opportunities 66 are occurring periodically, e.g., every 500,000 shots while the laser is firing, and the amount of $F_2$ injection determined for each such inject opportunity for the respective chamber as noted above, e.g., with or without a bulk gas also, e.g., Ar and Ne or Kr and Ne.

Figure 4:
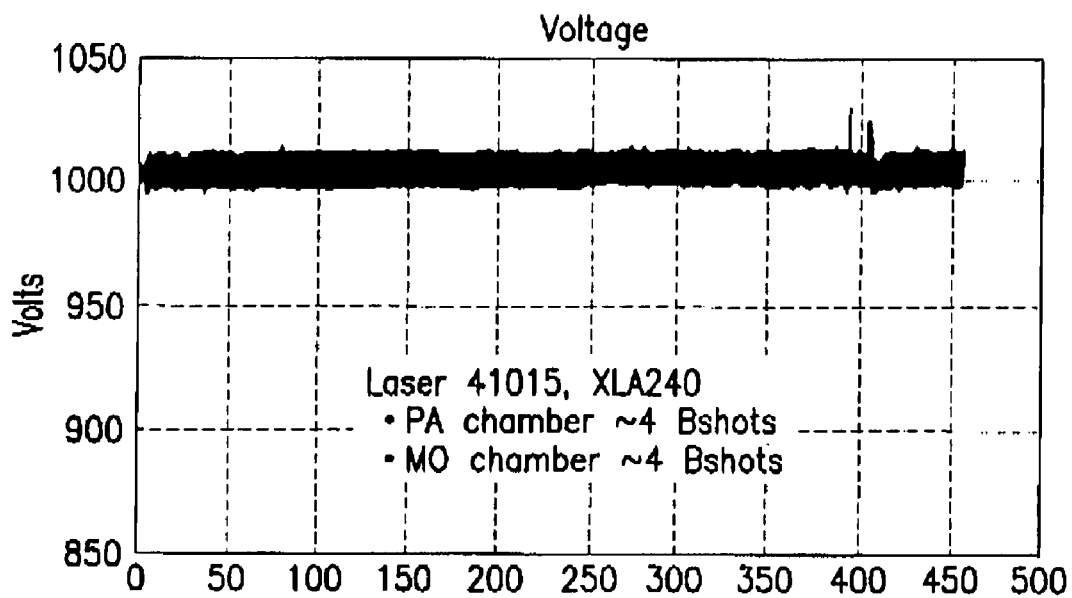
FIG. 4 illustrates performance with a multi-chamber laser gas control system, relating to charging voltage according to aspects of an embodiment of the disclosed subject matter.
Figure 5:
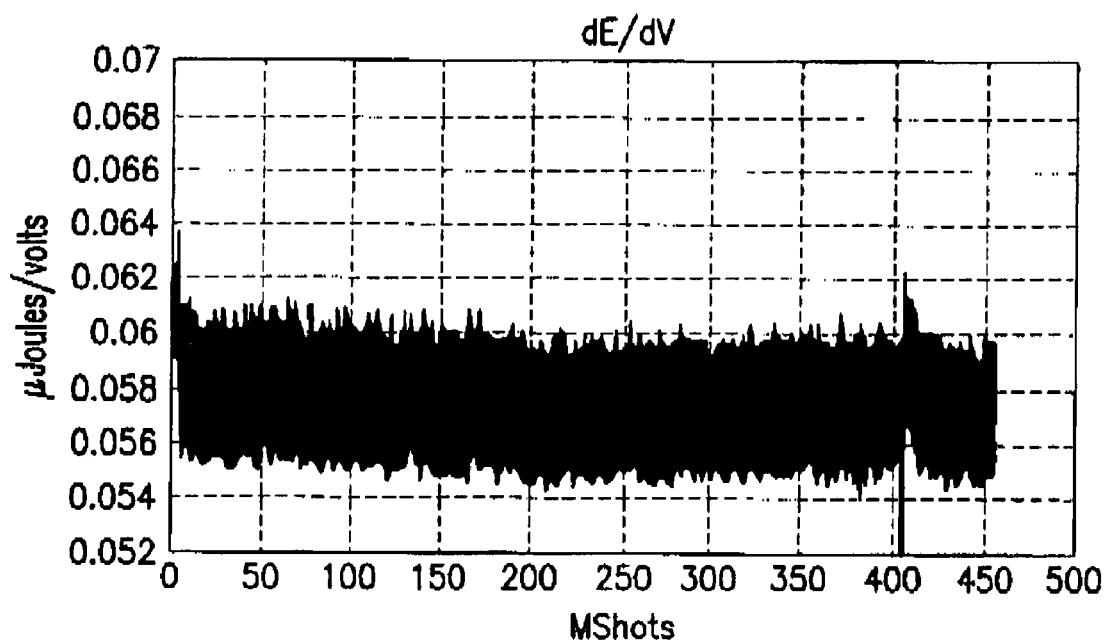
FIG. 5 illustrates performance with a multi-chamber laser gas control system, relating to dE/dV in μJ/volt, e.g., in the MO output according to aspects of an embodiment of the disclosed subject matter.
Figure 6:
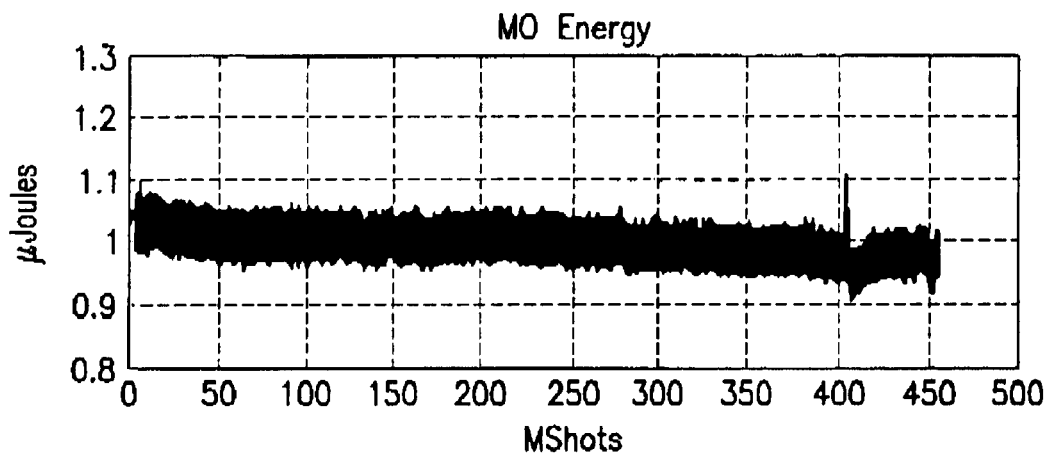
FIG. 6 illustrates performance with a multi-chamber laser gas control system, relating to MO output energy according to aspects of an embodiment of the disclosed subject matter.
Figure 7:
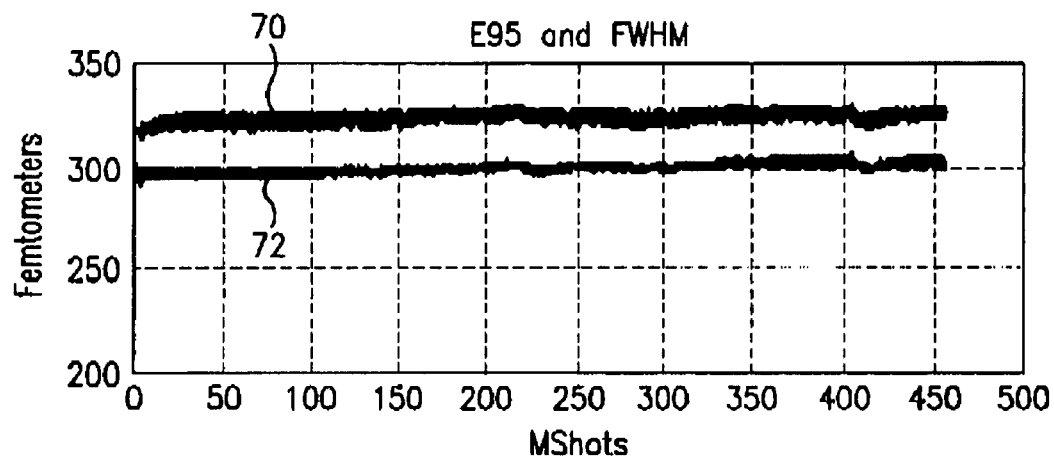

FIGS. 4-8 illustrate performance with a multi-chamber laser gas control system, operating by way of example with a fixed 69% Duty cycle, at a constant 10 mJ output from the PA, with a minimum $F_2$ inject size=0.7 kPa, and an ArNe Flush = 6.3 kPa, with FIG. 4 relating to charging voltage for both chambers (determining the ultimate voltage across the electrodes in each chamber), FIG. 5 relating to dE/dV in µJ/volt, e.g., in the MO output, FIG. 6 relating to MO output energy, FIG. 7 relates to bandwidth measurements, e.g., variation in E95% 70 and FWHM 72 in femtometers, and FIG. 8 relates to dtMOPA.

FIG. 9 illustrates a test of the ability to maintain charging voltage in a MOPA system with, e.g., a MO chamber that was at or near end of life, e.g., had already experienced 13B shots, and with no gas refills during an additional over 1B shots, with essentially zero net voltage change. The "spikes" reflect stoppages in the test run along the way. FIGS. 10A-C reflect other measurements during the same test run, e.g., MO output energy (10A), E95% 70 and FWHM 72 bandwidth (10B) and dtMOPA. FIG. 10A shows that MO output energy converges to about 0.4 mJ. FIG. 10B shows that both bandwidth measurements remain relatively stable, with some variations that applicants have not yet explained. FIG. 10C shows that dtMOPA converges to about 26 ns and remains relatively stable.

FIGS. 11A and B show, respectively measurements of voltage and dE/dV for a different test run, e.g., with a more stressful firing profile using, e.g., short bursts with relatively long interburst intervals and changes in energy and duty cycle, and also including 4 hour pauses and 3 pauses of 10+ hours. The measurements in FIG. 11A reflect minimum, maximum and mean and show essentially zero net voltage rise over the approximately 1000 Mshots.

Figure 12A:
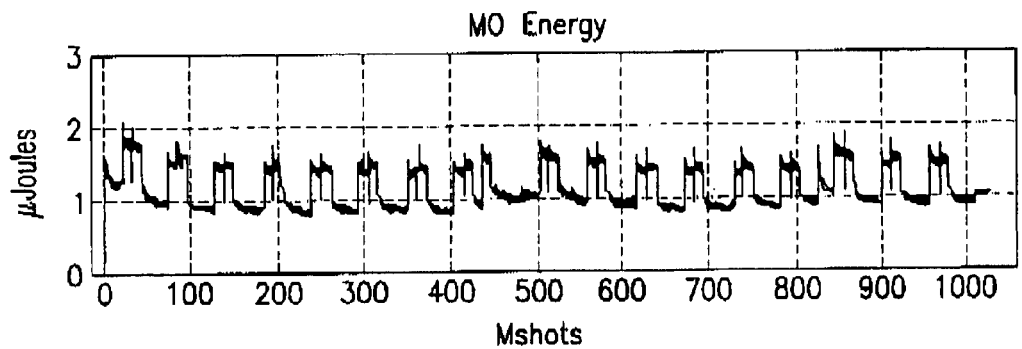
Figure 12B:
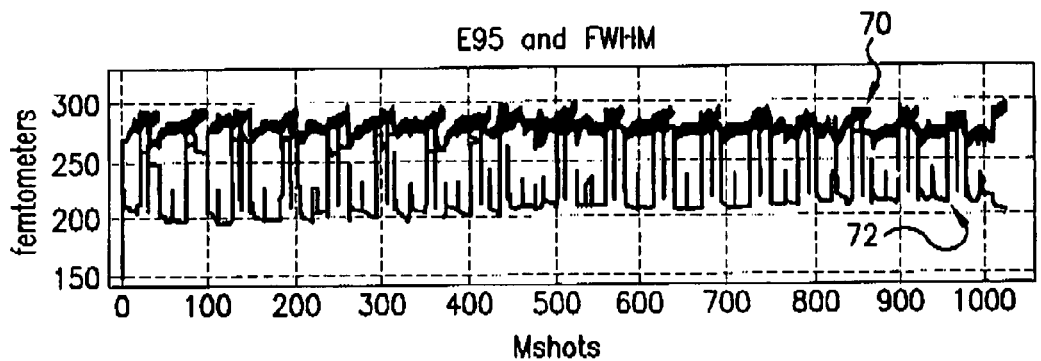
Figure 12C:
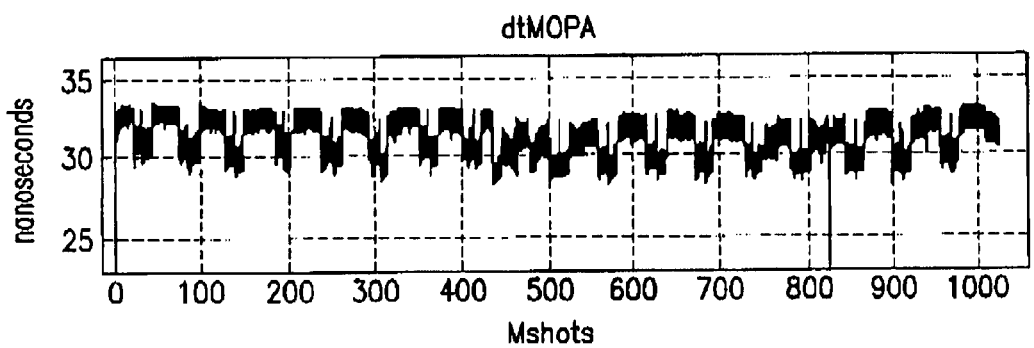

FIGS. 12A-C relate to measurements of Mo energy, bandwidth and dt MOPA over the same approximately 1B shots. Again the $E_{MO}$ is shown to converge to about 1 mJ, E95 70 remains relatively steady, while FWHM bandwidth 72 has some variations believed due to instrument error and dt MOPa remains relatively stable, e.g., at around 32.5 ns when the laser is firing.

FIG. 13 illustrates $F_2$ consumption variation, which decreases in an about linear fashion over a little more than 4B shots.

Turning to FIG. 14, there is illustrated steady state gas concentrations as a function of various flush rates. Increasing the overall inject concentration raises the lines linearly, though it is not shown in the figure. Assuming, e.g., a maximum consumption rate of 0.5 kPa/Mshot based on the graph of FIG. 13, it appears that the gas control system can operate to the left of the line 100 at a 0.5 kPa/Mshot $F_2$ consumption rate. It can also be seen that for a representative mean $F_2$ consumption, the 7 kPa injection flush rate yields about 60% of the nominal concentration and the 13 kPa represents yields about 80%.

The following terms shall have the listed meanings according to implementing aspects of an embodiment of the disclosed subject matter.

$W_F$=F2 flush rate for one chamber (kPa/million shots [Mshot])
$W_R$=rare gas flush rate for one chamber (kPa/Mshot)
$W_{flush}$=Total gas flush rate for one chamber (kPa/Mshot)
F=ratio of F2 to rare gas in flushing (dimensionless)
$G_F$=size of an F2 inject for one chamber (kPa/inject)
$G_R$=size of a rare gas inject for one chamber (kPa/inject)
$G_t$=total maximal inject size, if both injects occurred at the same time for one chamber (kPa/inject)
$S_F$=chamber shots between F2 injects (Mshots/inject)
$S_R$=chamber shots between rare gas injects (Mshots/inject)
k=number of rare gas injects between F2 injects on one chamber (dimensionless)
T=time to perform a maximal inject, i.e. F2+rare gas for one chamber (seconds)
P=laser frame shot accumulation rate (Mshots/sec)
N=number of chambers on the laser Applying these definitions to relate these variables yields:

F2 flush rate for one chamber (kPa/Mshot)=size of an F2 inject for one chamber (kPa/inject)/chamber shots between F2 injects (Mshots/inject), i.e., $$W_F = \frac{G_F}{S_F}(Kpa/Mshot); \quad \text{(Eq. 1)}$$

rare gas (e.g., neon and argon or neon and krypton) flush rate for one chamber (kPa/Mshot)=size of a rare gas inject for one chamber (kPa/inject)/chamber shots between rare gas injects (Mshots/inject), i.e., $$W_R = \frac{G_R}{S_R}(Kpa/Mshot); \quad \text{(Eq. 2)}$$

total gas flush rate $W_{flush}$ for one chamber (kPa/Mshot),=$F_2$ flush rate plus the rare gas flush rate, i.e., $$W_{flush}=W_F+W_R \quad \text{(Eq. 3);}$$

the ratio F of F2 to rare gas in flushing (dimensionless)=the $F_2$ flush rate divided by the rare gas flush rate, i.e., $$F = \frac{W_F}{W_R}; \quad \text{(Eq. 4)}$$

the number k of rare gas injects between F2 injects on one chamber (dimensionless)=chamber shots between F2 injects (Mshots/inject) divided by chamber shots between rare gas injects (Mshots/inject), i.e., $$k = \frac{S_F}{S_R};\quad \text{(Eq. 5)}$$

the total maximal inject size $G_t$, if both injects occurred at the same time for one chamber (kPa/inject)=the inject size for $F_2$ plus the inject size for rare gas, i.e., $$G_t = G_F + G_R \quad \text{(Eq. 6);}$$

and the ratio of $F_2$ inject size to rare gas inject size=k times the ratio of $F_2$ to rare gas flushes, i.e., $$\frac{G_F}{G_R} = kF. \quad \text{(Eq. 7)}$$

It is presumed that the maximum allowed total inject size, $G_t$, will be known, e.g., from dE/dV or other measurements that indicate adverse consequences from an inject on one or more laser operating parameters, such as the change in laser output pulse energy for a given change in charging voltage. $G_t$ will also have a lower bound, since the minimum size of an inject is limited by physical constraints, e.g., the gas injection hardware and the ability of the controller to precisely control the inject beyond the particular size lower limit. The maximum laser frame shot accumulation rate P and the maximum inject duration T are also presumed to be known. The gas mix ratio, F, is typically the same as the initial refill ratio, which may or may not be the same for both or all chambers in a multi-chamber laser system, but is assumed to be for purposes of this description of aspects of an embodiment of the disclosed subject matter. Such values may be determined, e.g., by experimentation or empirically over the operation of one or more similar laser systems, and a value for the total flush rate, $W_{flush}$, has been determined from experiments to be between 7 and 10 kPa/Mshot. The value of the inject rate ratio, k, can be used, e.g., to parameterize the overall results. The equations above can be used to derive the following relationships.

$$S_F = \frac{k(F+1)}{kF+1}\frac{G_t}{W_{flush}} \quad \text{(Eq. 8)}$$

$$S_R = \frac{F+1}{kF+1}\frac{G_t}{W_{flush}} \quad \text{(Eq. 9)}$$

It is useful and practical, e.g., to constrain k to be a positive integer and mostly k only needs to assume integer values, e.g., where an F2 inject occurs on an even multiple of rare gas injects. That is, every k rare gas injects, an F2 inject is also performed, including where k is 1. When $k \geq 1$, $S_R$ determines the minimum number of shots between injects. $S_R$ can, e.g., be greater than the total number of shots required to perform an inject on all chambers including when there is only one chamber (otherwise, a new inject would start before the completion of the prior injection into the chamber(s).

$$S_R \geq NTP \quad \text{(Eq. 10)}$$

The lower bound on $G_t$ may be determined from the lower bound on a single inject size, $G_{min}$. First $$G_F = \frac{kF}{1+kF}G_t \quad \text{(Eq. 11)}$$

$$G_R = \frac{1}{1+kF}G_t \quad \text{(Eq. 12)}$$

The gas inject ratio F may be around 1/5.7 to 1/9 for ArF lasers, e.g., around 1/6.9, according to aspects of an embodiment of the disclosed subject matter, and probably never greater than 1/7. Therefore, as long as $k \leq 7$, $0 < kF < 1$, implying that $G_F$ is the smaller of the two inject sizes of Equations (11) and (12). Therefore, the minimum inject size constraint can be given by:

$$G_F \geq G_{min} \Rightarrow \frac{kF}{1+kF}G_t \geq G_{min} \Rightarrow \quad \text{(Eq. 13)}$$
$$G_t \geq \left(1+\frac{1}{kF}\right)G_{min} \quad \text{for } 0 < kF < 1$$

Constraints (10) and (13) may also be coupled. To gain an intuitive understanding of how these constraints interact, the value of $S_R$ from Eq. 9 can be plotted for some typical expected values, e.g. as shown in FIG. 17. In this case, e.g., T can be 90 seconds, e.g., a currently used value for applicants' assignee's mult-chamber XLA series existing laser products) or 60 seconds (a possibly achievable value), P can be, e.g., 4500 shots/sec (e.g., a 75% duty cycle on a 6 kHz laser), N may be, e.g., 2 (for an XLA series laser), F may be 1/9 (e.g. a currently typical XLA laser gas pre-mix (fill/refill) ratio), $G_{min}$ may be, e.g., 0.7 kPa. The total flush rate $W_{flush}$ could be used at both its current value for XLA series laser systems (around 10 kPa/Mshot) or at an expected minimum value of around 7 kPa/Mshot. The total inject size could be allowed to vary from a selected minimum, e.g., as computed from Eq. 13 to a currently used value of 10 kPa, which currently is satisfactory and may be considered as an upper bound. The inject rate ratio k can also be varied.

Therefore, each set of lines for different values of k in FIG. 17, 200, 202 (k=1), 204, 206 (k=2), 208, 210 (k=3) and 212, 214 (k=4) envelope the possible values of the number of shots between injects, e.g., $S_R$. The lower lines in each set (202, 206, 210 and 214) can define, e.g., a maximal flush rate (e.g., $W_{flush}$=10 kPa/Mshot in one example). The left hand bounds for each set (200, 204, 208 and 212) can, e.g., define the constraint on total inject size from (Eq. 13). The black horizontal lines show the lower limit 220 and upper limit 222, e.g., based on the shot accumulation rate, P, and time to inject, T=60 (220) and T=90 (222), from the constraint of Eq. 10. When the lines 200-214 are below these respective T=60 and T=90 limits 220, 222, inject parameters meeting all constraints cannot be achieved. Each marker in FIG. 17 represents a data [point for a given inject size between 60 and 90 in this example. Because inject sizes have been quantized, it is not possible to select arbitrarily precise inject sizes. This lack of precise inject sizes can apply to both $G_F$ and $G_R$, to yield a final quantized Gt. For example, for k=1 (200, 202 in FIG. 17), it can be seen that there are a few gaps in the inject size points. This is due to lack of available resolution on the inject size. therefore, e.g., the set of allowable parameters lies on any of the $S_R$ lines that are above the respective horizontal limit lines 220, 222.

In addition, in response to longer term modifications in laser input/output operating parameter values the gas controller may perform so-called Gas Optimization. This may include, e.g., a method for adjusting one or more members of a subset derived from, e.g., a set of measured laser operating system parameters, as outputs of the controller, e.g., comprising, for an exemplary MOPA multi-chamber laser system: MO chamber total pressure, PA chamber total pressure, MO chamber partial pressure of $F_2$, PA chamber partial pressure of $F_2$, MO chamber inject $F_2$ concentration, PA chamber inject $F_2$ concentration, MO Chamber Gas Temperature, PA Chamber Gas Temperature, frequency and size of gas replenishments (injects) in MO chamber and frequency, size of gas replenishments (injects) in PA chamber, charging voltage ("voltage"). to optimize the laser efficiency, over the long term of operation, e.g., billions of shots, the following objectives may be pursued, e.g., (1) maximizing the time or shot accumulation before one or more signals, e.g., representing one of the above noted set of inputs, intersects an operational or user-chosen boundary condition (e.g. voltage rising to the upper operating limit); (2) minimization of a subset, $S_1$, of parameters, e.g., from the above noted set, in combination with maximization of a subset, $S_2$, of parameters, e.g., from the above noted set, with weightings and/or normalizations applied to the subset members to assign an order of importance, whereby, subset $S_1$ or $S_2$ may be an empty set; and minimization of a norm value, e.g., the Euclidean distance metric or other norm between a subset of parameters, $S_3$, e.g., from above referenced set and nominal values for those parameters of subset $S_3$ chosen by the same or other means.

This may be subject to soft, hard or general constraints, or a combination thereof, e.g., a soft constraint which sets a boundary condition that may be violated but with an assigned penalty that makes it undesirable for the optimization to continue in this direction, a hard constraint which sets a boundary that cannot be crossed by signal values, and general constraints being functions of any subset of elements, e.g., from the set noted above.

For example the system controller may use a set of measured laser operating system inputs or outputs referred to as Inputs to the controller={the set G:={V, Emo, Epa, Esh, dtMOPAtarget, E95, FWHM, MO pressure, PA pressure, MO partial pressure, PA partial pressure, wavelength, MO Temperature, PA Temperature, Laser discharge duty cycle}, and any first or higher derivatives of any members of G with respect to any other members of set G, and any members of G normalized, scaled or offset by any other members of G or any other internal or external signal that still correlates with a member of set G.

The controller may perform, e.g., a mathematical algorithm which may involve one or more of the members from either of the sets Inputs or Outputs. Such an algorithm may result in the production of a set of numeric metric values that may be ordered according to an objective criteria or a continuous function that may, e.g., be solved for maxima or minima according to an objective function criteria. The solution or solutions of this algorithm may be deemed the "optimal" solution or solutions and can, e.g., provide the values for the chosen members from the set Outputs. the performance of such an algorithm may be repeated manually, semi-automatically or automatically as often as desired (e.g., measured in shots or time) over the lifetime of the laser (so-called iterative feedback), or the optimization may be performed once and a set of outputs derived that are to be applied sequentially at future laser ages (e.g., based on a selected shotcount(s) or time(s)) such that a predicted optimal solution can be achieved (so-called open loop). Either, or a combination of both, iterative feedback and/or open loop may be employed to achieve the objective criteria.

According to aspects of an embodiment of the disclosed subject matter, e.g., illustrated by way of example in FIG. 15 an optimization algorithm 180 may be provided with at least one input, e.g., a plurality of inputs Voltage ("V") 192a, MO energy ("$E_{MO}$") 192b, PA energy ("$E_{PA}$") 192c, shutter energy at the laser system output ("$E_{Sh}$") 192d and bandwidth ("$E_{95\%}$", "FWHM") 192e, etc., such as some other operational spaces of the laser system, e.g., total pressure, voltage ranges, duty cycles, etc. The mathematical algorithm 190 may then be utilized to place constraints, e.g., on the maximum and/or minimum values of these inputs and, e.g., using rates of signal change over laser operating lifetime, e.g., $\delta V/\delta shots$, for one or more of the inputs, e.g., 192a-e, the algorithm may be used to determine, e.g., values of MO and/or PA total fill pressure 194a and 194b respectively. these values may be determined such that, e.g., if the laser system was left indefinitely with these settings for MO total fill pressure 194a and Pa total fill pressure 194b, the system would continue to operate for the maximum number of accumulated shots before one of the inputs intersected with one or more of the constraints. this may then be repeated periodically, e.g., every 500M or 1B shots or combination of time and shots, e.g., to derive new values for MO and PA total fill 194a, 194b, such that, e.g., the combined effect is to adjust the laser efficiency so as to maximize the operation lifespan of the laser with respect to, e.g., shots accumulated.

FIG. 16 may be seen to illustrate this example of aspects of an embodiment of the disclosed subject matter, e.g., how such optimization can be used to, e.g., maximize operational lifespan, e.g., using one set of derived outputs and then repeating this optimization and deriving subsequent sets of outputs, which may possible be different sets, combining to achieve the objective of maximizing the laser operational lifespan. The optimization may also, as noted above be executed only once, and where the aging rates of signals were known, e.g., from empirical determinations, then a predicted set of outputs to be applied at specific times in the future could be derived and applied in an open loop manner. The iterative feedback method, however, may be expected to yield more robust results.

Turning to FIG. 16, the horizontal axis may represent laser system lifetime, e.g., as measured by shot count and the vertical axis some laser system operational input or output parameter from the above noted set of inputs, e.g., 192a-e. An output setting, e.g., MO total pressure 194a may have a starting value 196a, e.g., at the beginning of laser lifetime, and over a number of shots, e.g., 500M may progress along a trajectory 198a toward a constraint limit 199, along, e.g., some exponential curve and at some point where the trajectory begins to accelerate, e.g., the rate of $\delta$input signal/$\delta$shots, e.g., $\delta V/\delta shots$, the controller may select an opportune time to perform optimization at point 196b, initiating a new trajectory 198b. The system may again be optimized at point 196c initiating yet a third trajectory 198c. At some point the starting point (not shown) after an optimization may be close enough to the constraint 199 and/or the trajectory steep enough toward the constraint 199 such that a different input signal may be used for the optimizations, e.g., $V_{REF}$, which may be substituted in the y axis of FIG. 1 and a constraint, e.g., an upper constraint 199 may be established, and, e.g., the original MO total pressure reestablished.

According to aspects of an embodiment of the disclosed subject matter, using a more or less continuous refill to, e.g., eliminate the downtime associated with chamber refills, applicants have examined the effect of continuously replacing $F_2$ and bulk gas (buffer gas neon and rare laser gas, e.g., Ar or Kr. Several approaches are possible for such more or less continuous refill, including mass flow control, or sequences of many small bulk gas and $F_2$ injects. For simplicity, and for discussion of aspects of an embodiment of the disclosed subject matter one may treat the injection of bulk gas and $F_2$ as a continuous process. The use of discrete injects does not significantly change the results of the analysis. The gas state can be characterized by two state variables, the amount of $F_2$ in the gas, y, and the amount of contaminants built up in the gas, x. At any point in the gas life, the system may be injecting fluorine at an average rate of $r_y$ and bulk gas at a rate of $r_z$. As the laser is fired, $F_2$ is consumed at a rate, $w_y$, and contaminants build up at a rate of $w_x$. Furthermore, there can be, e.g., some additional change of the amount of bulk gas, $w_z$, presumably due to conversion of $F_2$ mix to bulk gas or conversion of bulk gas to contaminant. Gas may be exhausted at a rate, re, to keep the total pressure of the gas constant.

$$r_e = r_y + r_z + w_x - w_y + w_z = r_y + r_z + w \quad \text{(Eq. 14)}$$

Where w is the net pressure change due to contaminant buildup, $F_2$ depletion and bulk gas conversion. The differential equations describing the $F_2$ and contaminant concentrations may be considered to be:

$$\frac{dx}{dt} = -\frac{x}{P}r_e + w_x = -\frac{x}{P}(r_y + r_z + w) + w_x \quad \text{(Eq. 15)}$$

$$\frac{dy}{dt} = -\frac{y}{P}r_e - w_y + r_y = -\frac{y}{P}(r_y + r_z + w) - w_y + r_y \quad \text{(Eq. 16)}$$

Where P is the total pressure in the chamber. Regardless of whether refill is being done continuously or intermittently en masse, an $F_2$ injection controller could still be used. The effect of the $F_2$ injection controller could be to regulate the $F_2$ injection rate, e.g., to keep the $F_2$ concentration, y, in the chamber constant. Setting dy/dt to zero and solving for $r_y$ gives:

$$r_y = \frac{w_y + \frac{y}{P}(r_z + w)}{1 - \frac{y}{P}} \quad \text{(Eq. 17)}$$

Applicants' assignee's current manner of replenishing gas is with a so called discrete refill, which does not inject bulk gas (neon buffer and/or neon buffer along with rare laser gas, e.g., Ar or Kr) during the gas life (ignoring the small amount used to push $F_2$ out of the line gas feed line during a fluorine inject, which is done, e.g., to better control the amount of fluorine injected each time). Therefore, during the gas life, $r_z$, is identically zero (or essentially so). Setting $r_z$ to zero and substituting Equation 4 for $r_y$ gives:

$$\frac{dx}{dt} = -\frac{x}{P}(r_y + w) + w_x \quad \text{(Eq. 18)}$$

$$= -\frac{x}{P}\left(\frac{w_y + \frac{y}{P}w}{1 - \frac{y}{P}} + w\right) + w_x$$

$$= -x\left(\frac{w_y + \frac{y}{P}w}{P - y} + \frac{w}{P}\right) + w_x$$

$$= -x\frac{w_y + w}{P - y} + w_x$$

In general, the rate of $F_2$ depletion and contaminant build-up appear to be dependent at least in part on laser duty cycle and therefore can vary over time. It is useful, however, to consider the case where the laser is fired at a steady duty cycle. In such an exemplary case, Eq. 18 can be solved in closed form to find x:

$$x(t) = \frac{w_x}{k}(1 - e^{-kt}) \quad k = \frac{w_y + w}{P - y} \quad \text{(Eq. 19)}$$

Defining a gas life to be a duration, e.g., T. the contaminant concentration at the end of a gas life can therefore be determined to be, e.g.:

$$x_f = \frac{w_x}{k}(1 - e^{-kT}) \quad \text{(Eq. 20)}$$

The total amount of $F_2$ injected plus a refill could be determined to be, e.g.:

$$F_2 = Tr_y + y = T\frac{Pw_y + yw}{P - y} + y \quad \text{(Eq. 21)}$$

Considering now a continuous refill, e.g., where the laser is in a constant duty cycle, but bulk gas (e.g., buffer gas neon, or buffer and rare gas, e.g., neon and argon or neon and krypton) at a rate such that one would, e.g., inject a refill's worth of laser gas during the gas life can be determined to be, e.g.:

$$r_z = \frac{P - y}{T} \quad \text{(Eq. 22)}$$

Substituting into Eq. 17

$$r_y = \frac{w_y PT + yP - y^2 + ywT}{T(P - y)} = \frac{y}{T} + \frac{Pw_y + yw}{P - y} \quad \text{(Eq. 23)}$$

During the period of, e.g., one "gas life", the total $F_2$ injected can be determined to be:

$$F_2 = Tr_y = y + T\frac{Pw_y + yw}{P - y} \quad \text{(Eq. 24)}$$

Comparing to Eq. 21 it can be seen that the amount of $F_2$ injected during the period of a conventional gas life using, e.g., a continuous refill is identical to the total amount of $F_2$ used with, e.g., a conventional refill. In other words, the net $F_2$ injection rate/amount can be determined to be essentially the same, e.g., within allowances for, e.g., measurement errors and gas not fully transferred to the chamber by the gas control system piping and manifolds and the like.

Plugging Equations 22 and 23 into Equation 15 gives a differential equation describing the contaminants present when using continuous refill.

$$\frac{dx}{dt} = -x\frac{P - y + w_y T + wT}{T(P - y)} + w_x \qquad \text{(Eq. 25)}$$

If one runs a continuous refill long enough, one can, e.g., eventually converge to a constant level of contaminants. Setting the derivative in Eq. 25 to zero and solving for x gives:

$$x_f = \frac{w_x T(P - y)}{P - y + T(w_y + w)} = \frac{w_x}{k}\frac{1}{1 + 1/(kT)} \qquad \text{(Eq. 26)}$$

With respect to a continuous vs. discrete refill, by comparing Equation 26 to Equation 20, there can be seen, e.g., the effect of continuous and discrete refills on the contamination level, e.g., at the end of a conventional gas life:

$$x_f = \frac{w_x}{k}(1 - e^{-kT}) \text{ discrete refill} \qquad \text{Eq. 27}$$

$$x_f = \frac{w_x}{k}\frac{1}{1 + 1/(kT)} \text{ continous refill}$$

The term, k, can be considered to be a normalized conventional gas life period. The contaminant levels using continuous and discrete refills at the end of a gas life period can be seen to be nearly identical (within the tolerances noted above) with the exception of two different functions:

$$f(kT) = 1 - e^{-kT} \qquad \text{Eq. 28}$$

$$g(kT) = \frac{kT}{kT + 1}$$

If one were to plot these functions against kT, one would see that for all values of kT, f(kT) is greater than g(kT), which can be interpreted to mean that with continuous refill set to replace the gas once every gas period, the concentration of contaminants should converge to a value less than that attained using a discrete refill at the end of the gas life. Comparing kT to the total amount of $F_2$ injected during a discrete gas life:

$$F_2 = Tr_y = T\frac{Pw_y + yw}{P - y} \approx T\frac{Pw_y}{P - y} \approx PT\frac{w_y + w}{P - y} = P(kT) \qquad \text{Eq. 29}$$

Approximations may be taken assuming, e.g., that the net amount of gas produced due to $F_2$ consumption and contaminant buildup is close to zero, a not unreasonable assumption. applicants' employer has seen, e.g., in tests where the laser is fired for a long period of time without injecting, that pressure stays approximately constant. The consequence of equation 29 may be seen to be, e.g., that kT is essentially the ratio of the total $F_2$ injected during a discrete gas life to the total fill pressure. Typically, a total fill for a chamber is around 300 kPa and during a gas life, we there may be injected around 30 kPa, which gives, e.g., a reasonable value for k of about 0.1. The plot noted above would show, e.g., that g(k) and f(k) are approximately equal, e.g., when the normalized gas life k is less than or equal to 0.1 Therefore, one can conclude that the concentration of contaminants when at the end of an inject period could be approximately equal using either discrete or continuous inject for the same amount of bulk and $F_2$ gas.

This result is not surprising when one considers that in both the discrete fill and continuous fill cases, chamber gas is being exhausted, e.g., during gas life with continuous fill and at the end of gas life with discrete fill, e.g., with similar concentrations of contaminants. It makes sense that the total amount of gas needed to completely exhaust one gas life's worth of contaminants would be about the same.

Based upon the above noted analysis of the levels of $F_2$ and contaminants in a chamber using discrete and continuous injects, applicants' employer has concluded, e.g., that (1) when the fill rate of bulk gas is set to inject one fill's worth of bulk gas life, e.g., in one gas life period, the total amount of $F_2$ injected during continuous fill is equal to the total amount injected during discrete fill (including the initial one chamber refill), and (2) with continuous fill and a bulk gas inject rate set, e.g., to inject a chamber's worth of bulk gas in a gas lifetime period, the level of contaminants will converge to a value less than that reached at the end of a gas life with discrete fill. With typical gas lives, the level of contaminants can be seen to converge to approximately equal to that at the end of a discrete gas life.

According to aspects of an embodiment of the disclosed subject matter, it may be seen that a proposed new way to inject gas into the laser system in both the single chamber and multi-chamber laser systems is Gas Refill Elimination ("GRE"), otherwise referred to as open loop gas replenishment and/or continuous or pseudo-continuous gas replenishment. This can be done by periodic injections or, a continuous injection, e.g., with a mass flow valve, were we to have mass flow valves in our gas replenishment hardware and trust that they would operate to control the gas injection in a continuous or roughly continuous mode of injection, which we do not as to the former and apparently also do not as to the latter.

Therefore, periodic injections will be made so frequent and of such small amount, as to be approximately continuous. The injections will be of fluorine and an amount of gas mix, e.g., Kr and neon or Ar and neon, periodic injections of fluorine and such a gas mix interspersed with injections of only the gas mix (i.e., with no fluorine in the interspersed injections). After the inject is complete, the total pressure in the chamber is bled down to the selected total pressure for the chamber. By doing so, as the injections are made, not only is fluorine replaced, but also the Kr/Ne or Ar/Ne balance tends to be maintained and contaminants are removed by a bleed down process after the injection to return to the total gas pressure for the chamber in question, i.e., a single chamber or a seed laser or amplification stage laser, e.g., an MO or a PA, wherein the refill amounts and total pressures differ from seed laser chamber to amplification laser chamber.

The effect is to substantially reduce the need for gas refills or, in the limit, eliminate such need, by increasing dramatically the time between the need for a refill. This may be evidenced, e.g., by the charging voltage not raising to a level where maintaining output pulse energy with voltage is not possible, e.g., due to contaminant buildup and fluorine consumption.

Over time the total pressure in the chamber may be adjusted upward and or the refill concentration (flush rate)

changed to further remove contaminants. The may be done, e.g., by adding fluorine and then a mix of, e.g., Ar and Ne or a mix of, e.g., $F_2$, Ar and Ne, to above the new desired higher total pressure and then performing a bleed down to the new desired higher total pressure, thus further removing contaminants in the process. This optimization of, e.g., the total pressure in one chamber or another or both is particularly of importance in keeping the amplifier portion, e.g., a PA, from reaching the condition where $V \geqq V_{MAX}$, i.e., such that voltage regulation of output pulse energy is ineffective. Also from time to time the flush rate may also be adjusted, e.g., by adjusting the relative concentration of noble/inert gasses to $F_2$, e.g., changing from 2 parts Ar/Ne to one part $F_2$ to four parts Ar/Ne to one part $F_2$, or by adjusting the number of interspersed injects without fluorine in them. These changes over time can occur, e.g., every hundred million shots or so, and are referred to as Gas Optimization ("GO"). They seek to reset the path of the voltage curve approaching $V_{MAX}$ such that voltage never reaches $V_{MAX}$ over a period essentially equal to chamber life, but certainly well in excess of the approximately 100M shots between gas refills with existing gas management.

These changes in total pressure and/or flush rate may be determined from feedback regarding a parameter of the laser operation or a rate of change in a parameter with another parameter, e.g., V, dE/dV, dV/dshot count, E, bandwidth, etc. over the life of the laser. In addition, the initial flush rate may be selected to optimize the injection of fluorine and mixed gases to replenish fluorine and bleed off contaminants, given the capability of existing gas management hardware to carry out such injects, and in the case of multi-chambered systems to carry out repeating serial injects in the respective number of chambers as a lower limit and to not cause ill effects on such laser parameters as dE/dV, output energy or bandwidth due to the occurrence of an inject as an upper limit.

According to aspects of an embodiment of the disclosed subject matter a gas control system, e.g., for single or multiple chamber laser systems, such as an exemplary two chamber MOPA or MOPO seed laser amplifier laser system, may be considered to include, e.g., a core algorithm. Turning to FIG. 1 there is illustrated by way of example a laser gas controller 20 employing such an algorithm for an exemplary MOPA laser system 30. At selected inject sequence(s), based, e.g., on shot count being compared to a preselected shot count between injection opportunities in block 22 the exemplary core algorithm may determine that there is presently occurring an injection opportunity and signal this to a controller 28. In addition, voltage dtMOPA and energy out of the MO may be compared in comparators 34a-c respectively to their respective selected reference values comprising a portion of, e.g., a NAFFA feed back control loop comprising an $F_2$ consumption estimation calculator 24, which compute an $F_2$ inject size for a respective chamber, MO or PA in the exemplary system. In block 26 saturation low or high of the $F_2$ inject size may occur.

In addition, bulk gas, e.g., KrNe or ArNe may, e.g., along with the calculated amount of $F_2$ at the time of the injection opportunity and may, e.g., be selected to always be injected into the respective chamber at each injection opportunity for the respective chamber, regardless of the calculated amount of $F_2$ being above some minimum injection amount Inject$_{min}$ (INJ$_{MIN}$) or not.

Referring now to FIG. 2, an open loop injection controller 40 may also determine the occurrence of an injection opportunity for the respective chamber 30 (shown in FIG. 1) based on the passage of some time (or shot count or both), e.g., being compared in a comparer 42 to a selected time (or shot count) and providing an injection opportunity signal to the controller 46. A preselected amount of $F_2$, e.g., a passive or open loop amount of $F_2$, which in block 44 is saturated low or high may be injected into the respective chamber along with the selected amount of bulk gas, at each injection opportunity, or just bulk gas may be injected at some injection opportunities and the mixture with a selected amount of $F_2$ may occur at selected intervals, e.g., every third or every fourth injection opportunity. The system of FIG. 2 could, e.g., use the same injection opportunity determination for the respective chamber(s), such that they coincide and/or the two bulk gas injection sizes could be totaled to amount to the desired full amount of ArF/KrF injection for each such injection opportunity or the bulk gas could, e.g., only be injected by the feedback controller 20 or the open loop/passive controller 30 at each respective injection opportunity.

The size of the KrNe/ArNe bulk gas injection, e.g., in the open loop or passive $F_2$ injections may be fixed and "large" (e.g. 1:6.3 kPa to 1:9 kPa $F_2$:ArF/KrF), e.g., versus currently used about 2 kPa bulk gas injections along with an injection of $F_2$ at about 1 kPa. The inject period (time/shots between injection opportunities may be selected to yield a minimum gas refresh rate (kPa/Mshot) or a refresh rate within some range of desired refresh rates, e.g., from RATE$_{refreshMIN}$- .RATE$_{refreshMAX}$. An F2 inject size may be, e.g., saturated both low and high, e.g., according to aspects of an embodiment of the disclosed subject matter, with a minimum $F_2$—ArNe (KrNe) ratio on any inject equal, e.g., to the original pre-mix refill concentration (1:9). Other possible embodiments may use other ratios, e.g., 1:6.9 for the reasons noted above.

In addition, according to aspects of an embodiment of the disclosed subject matter, purely passive injects may be treated similarly to the open loop ones, according, e.g., to a Passive Consumption Algorithm, which may, e.g., be essentially the same as currently used NAFFA for multi-chamber laser systems and AFI 2 for single chamber laser systems, e.g., injecting a fixed size and with an $F_2$—ArNe (KrNe) ratio at a fixed period of time accumulating while the laser is not firing shots. this fixed amount of $F_2$ can, e.g., change, e.g., over chamber life using existing look-up table, reflective, e.g., of empirically determined long term changes in gas consumption, e.g., as shown by way of example in FIG. 13 that $F_2$ consumption can decrease over chamber life. According to aspects of an embodiment of the disclosed subject matter it may be necessary to include an ability to change inject ratio as well as rate, over chamber life for similar reasons, which could, e.g., be an optional/configurable feature.

As noted above, according to aspects of an embodiment of the disclosed subject matter, such things as the bulk gas (ArNe, KrNe) refresh rate needed may be determined, e.g., from such factors as the contamination rate, e.g., the maximum contamination rate, the $F_2$ consumption rate, e.g., the maximum F2 consumption rate, and what may need to be done to account for, e.g., whether the algorithm handle large changes during a very long gas life (e.g. greater than 500,000, 000 shots), what can be done to detect if gas life may be ending and updating inject orifice measurements, e.g., on every inject if variance so dictates. As noted above, according to aspects of an embodiment of the disclosed subject matter the flush rate high enough, e.g., with 1:6.7-1:9 $F_2$:bulk gas for the illustrative lasers, and within the bounds and ranges noted above, and with perhaps also feedback varying of the $F_2$ injection amounts or, as noted, perhaps zero $F_2$ injection in some selected periodic injection opportunity slots or unless dictated by consumption estimation feedback, enough flushing and $F_2$ injection can result in an effective steady state condition for both $F_2$ and contaminants. In addition with steady state $F_2$ maintained high enough, and steady state contaminants maintained low enough, one could achieve long gas lives the necessity for conducting refills or at least conducting them far less frequently, e.g., on the order of a billion(s) shots between refills rather than 100M.

For example, according to aspects of an embodiment of the disclosed subject matter using, e.g., a fixed inject mode, e.g., with a feedback control system like NAFFA one can periodically inject, e.g., at or about a usual refill concentration (F2: ArNe=1:9), or even less bulk gas percentage of the injection, as selected as noted above, with, e.g., the Size and frequency of injects selected to achieve a desired overall gas flush rate, which also may be the same for all chambers in a multi-chamber system, e.g., both chambers in an exemplary MOPA or MOPO arrangement, applicants have demonstrated gas lives of at least more than one billion shots, even under stressing firing pattern, such as large and frequent variations in duty cycle or target output energy. This can be done, as applicants employer has found, within constraints noted above on the size of injections allowed without placing other laser operating parameters out of specification during such an injection. Thus, e.g., changes in e.g., dE/dV and/or energy during an inject, has been shown to be able to meet specifications, which applicants attribute at least in part to the periodic contaminant flushing, whereby the gas state reaches/maintains a level that is close to the pre-mix inject concentration, so that injects do not cause any large disturbances. this may be contrasted to earlier inject control systems, e.g., NAFFA alone, which could typically inject into a chamber containing gas that is very different in concentration from that of the injects, thereby causing larger disturbances.

Applicants observed after replacing the amplifier laser portion lasing chamber, e.g., after 17 B shots, that open loop flushing repeatedly failed thereafter. This was so even after increasing flush rate to a pre-determined maximum. This is believed to have been caused due to the greatly increased $F_2$ consumption rate in the new PA, having a different internal debris management and electrode structure. $F_2$ concentrations and rates of change were then measured, as illustrated in FIG. 13. Estimates of $F_2$ consumption rates of other XLA lasers running NAFFA was also conducted. In making the estimates, e.g., as shown in FIG. 13, it was assumed that refill=0.1% $F_2$ concentration (to, e.g., normalize the $F_2$ monitor readings). Each measurement reflects a linear fit of at least 5 $F_2$ readings, e.g., at 1+Mshot apart, while each $F_2$ reading consisted of 3 separate samples.

FIG. 14 illustrates how $F_2$ consumption rate can impact gas state. The total flush rates, utilizing the pre-mix/refill gas composition ratio, e.g., of 1:9 $F_2$: bulk gas. FIG. 14 shows that increasing the inject flush amount, e.g., from 7 kPa, line 80, through 13 kPa, line 92, with 8 kPa, 82, 9 kPa, 84, 10 kPa 86, 11 kPa, 88, and 12 kPa 90 intervening, shows that the consumption rate decreases linearly.

Applicants have determined that open loop flushing could perhaps fail to maintain an acceptable gas concentration, e.g., in cases like a new chamber which may have, e.g., as indicated in FIG. 13 a high $F_2$ consumption rate, e.g., dependent on other operating parameters as well, e.g., duty cycle. More flushing could be required, e.g., when duty cycle is at a relatively high level, e.g., above 50% or so. However, with a lower duty cycle could then enable a required inject rate, e.g., flushing at 25 kPa/Mshot, to achieve refill elimination. applicants have also noted that open loop flushing may, e.g., not always yield a predictable gas state, or, for that matter, also may not yield predictable performance parameters.

However, refill elimination has been proven to work, despite the fact that using open loop flushing, e.g., with a pre-mix refill concentration injection may have some limitations as noted above under some conditions in some chambers. Flushing contaminants, e.g., with the open loop pre-mix refill concentrations of injected gas appears to be at least one factor in extending gas life. Uncertainty as to the exact or even approximate contamination rate, and also, e.g., changes therein over chamber lifetime may result in uncertainty as to the refill rate needed for the flush, however, applicants believe that refill elimination is possible even with relatively high $F_2$ consumption rates.

According to aspects of an embodiment of the disclosed subject matter applicants propose to flush chamber with bulk gas, e.g., ArNe, regularly, e.g., at every inject opportunity, no matter what, and also, e.g., using a relatively high proportion of bulk gas to $F_2$, including also allowing feedback control from $F_2$ consumption estimates, e.g., using a system such as NAFFA, to decide how much F2 to inject, e.g., with zero $F_2$ injected each open loop injection opportunity, or with the feedback control adding to the selected open loop injection of $F_2$, which may then be considered a minimum $F_2$ inject amount injected at each injection opportunity, absent a feedback loop decision to increase that amount. In addition, the system may provide, according to aspects of an embodiment of the disclosed subject matter, utilizing passive injects to account, e.g., for $F_2$ consumption when the laser system is not firing, e.g., under the control of a feedback control system such as NAFFA, which may estimate passive consumption, e.g., based on time elapsed during which the laser system is not firing.

According to aspects of an embodiment of the disclosed subject mater, therefore, the system may provide for an inject, e.g., at or about a selected refill concentration every selected number of shots or, e.g., some elapsed time, or a combination of both and thereby, e.g., force contaminant flushing. In addition, however, the system may be able, e.g., to increase the F2 inject rate as necessary, e.g., to compensate for varying $F_2$ consumption. This regular flushing can result, e.g., in stabilizing the gas state and greatly extending the gas life.

Since, as has been noted above the $F_2$ consumption rate can vary, e.g., by more than 5× over a chamber life, it appears that very high consumption rates may not be practically handled by just the open loop flushing. According to aspects of an embodiment of the disclosed subject matter open loop injections modified with a feedback loop, e.g., NAFFA can provide excellent performance low-consumption chamber to high consumption chambers.

According to aspects of an embodiment of the disclosed subject matter one may, e.g., stabilize the state of the excimer laser discharge gas for long periods, and, e.g., reduce or entirely prevent the need for full chamber gas replacement, therefore also, e.g., reducing laser unavailability necessary for full gas replacement, and in some cases for the prevention of laser operation for photolithography when injecting. According to such aspects of an embodiment regularly replacing a small portion of the laser gas at frequent intervals with fresh gas at a given concentration of Halogen gas (typically $F_2$) and bulk or buffer gas (typically Argon-Neon or Krypton-Neon). The amount of replacement is small enough to not excessively disturb important laser parameters, and it is frequent enough that the gas reaches an acceptable steady state for continued and long term operation. Additionally, online gas optimization can be included to dynamically adjust a laser operating parameter, e.g., total chamber gas pressure to further prolong the need for a gas refill. The size of the adjustment may, e.g., be determined from the online gas optimization, and an actual adjustment may be made during the next and subsequent small gas inject replacements.

According to aspects of an embodiment of the disclosed subject matter, applicants have experimented to determine the effect(s) of large gas injections on laser operating parameters, e.g., dE/dV and effective energy on a laser system, e.g., a multi-chamber laser system, e.g., an XLA 200 laser of the type made and sold by applicants' assignee. Large injects, as discussed in the present application are part of a gas control algorithm intended to dramatically reduce the time between full chamber gas refills or essentially eliminate them over laser system operating life. applicants' assignee has termed the large laser chamber injections refill concentration injections or constant flush mode injections, whereby, e.g., the laser gas control system performs frequent and relatively large gas injections at, e.g., the same or nearly the same relative $F_2$ and bulk gas (ArNe for XLAs) concentration as the initial fill. This has been seen to effect the flushing away of contaminants and maintaining $F_2$ concentrations more steadily than previous gas control algorithms. According to aspects of an embodiment of the disclosed subject matter in order to achieve a sufficient level of net gas flow through the chamber(s), e.g., the size of the injects may be significantly larger than what has before been typically considered to be acceptable, e.g., which might cause changes in laser operating parameters subject to tight specifications, e.g., for laser photolithography DUV light source applications, e.g., dE/dV and (effective) energy, that could be higher than allowed by such specifications.

Therefore, applicants have conducted experiments to measure these effects, e.g., under a so called constant flush mode, specifically measuring, e.g., the change in dE/dV and effective energy for a variety of inject sizes. By modifying, e.g., a normal dE/dV estimator, e.g., such that dE/dV could be estimated relatively quickly, the system can be made to, e.g., capture "fast" behavior changes resulting from injects. An initial fill of MO: 38 kPa F2/380 kPa total pressure, PA: 28 kPa F2/280 kPa total pressure may be used for such an experiment and, e.g., the laser may be fired at a constant 75% duty cycle (4000 Hz rep rate, 1200 burst count, 0.1 sec burst interval), e.g., for 500,000 shots. The laser could then be fired in continuous mode at one of two rep rates, e.g., 3000 Hz or 800 Hz, for 90 seconds to allow thermal transients to decay. Then an inject could be initiated while maintaining the repetition rate.

The size of the inject (both $F_2$ and bulk gas) could be determined by a test schedule. During the inject, data could be collected of, e.g., laser voltage, energy, dE/dV timing, bandwidth, and other pertinent parameters, and chamber gas temperature and pressure can be logged at approximately 10 Hz. After the inject, the laser could be returned to the burst mode 75% duty cycle for another 500,000 shots, and the sequence can be repeated (e.g., with the same or a different continuous repetition rate and inject size as determined by the schedule).

To properly emulate a certain laser operating condition, e.g., a true constant flush mode of operation, a schedule can be selected, e.g., to include eight large injects at or near refill concentration, e.g., in between injects of other sizes, e.g., four for each chamber. That is, e.g., injects of 1.1 kPa $F_2$ and 9 kPa ArNe occurring for each chamber in a two chamber (seed/amplifier) laser system, e.g., with such a cycle repeated once. According to such a representative inject schedule, e.g., in between each inject, laser could be caused to fire at 75% duty cycle. The laser gas discharge repetition rate (output light pulse repetition rate) may be, e.g., held at a selected value, such as 3000 Hz or 800 Hz, for a selected period of time, e.g., 90 seconds prior to an inject, with the inject then occurring at the given rep rate.

After the experiment, streaming data may be processed to compute the change in dE/dV and effective energy during each inject. The results are presented in Table 1 below. In addition, the streaming dE/dV, effective energy, and bandwidth data. can be ensemble averaged, e.g., with the data at the same shot in each data set averaged across such data sets, producing an average shot history, with, e.g., ensemble minima and maxima also defined. Such ensemble averaging may be for each inject size, rep rate, and chamber. In addition, the ensemble minimum and maximum can be computed and plotted. The results of these can form envelopes and averages for each type, e.g., as illustrated in FIG. 19 for changes in dE/dV, effective output energy and e95 bandwidth for such approximately 10 kPa injects into, e.g., the MO, e.g., operating at 3000 Hz, with the upper band illustrating maximums, the middle bun means and the lower bands minimums. FIG. 20 illustrates the effects of similar injects into the Pa at 3000 Hz. The charts in FIGS. 19 and 20 represent averages over many injects. FIGS. 19A-C and 20A-C are illustrative of where the injects started and stopped, as well as certain possible strict specification limits, upper and lower lines, i.e., between 0 and 200 seconds.

To ensure that these experimental results represented, e.g., a predictable and relatively constant gas state, FIGS. 21A-C, illustrates that the overall voltage, bandwidth, and energies throughout the experiment. The values are seen to be changing slightly throughout the test, which may be due, e.g., to the experiment not being able to achieve a true constant flush mode, but only to approximate one, e.g., since the inject sizes during the experiment varied somewhat and it is believed that only the relatively large, e.g., 1.1:9 injects were at the appropriate concentration. Also, applicants noticed that bulk gas, e.g., ArNe, only injects may have encountered disruptive software constraints, such that, e.g., the overall concentration of the gas turned out to be slightly leaner (lower in $F_2$) than a true constant flush mode should be able to achieve. However, the experimental results were not invalidated, since there appears to be no corresponding trend in the resulting dE/dV and effective energy change data.

TABLE I

Statistics of changes during injects.

| Injected Chamber | Rep Rate, Hz | F2 inject, kPa | Bulk gas inject, kPa | % dE/dV change (min/max/mean) | % Energy change (min/max/mean) | E95 change, fm (min/max/mean) |
|---|---|---|---|---|---|---|
| MO | 3000 | 1.1 | 9 | 2.8/9.3/5.0 | 5.8/14.6/10.5 | 20.7/39.7/26.9 |
| MO | 800 | 1.1 | 9 | 4.5/10.9/6.8 | 4.4/9.4/7.4 | 16.0/32.0/21.5 |
| PA | 3000 | 1.1 | 9 | 7.7/14.5/10.8 | 7.2/12.8/10.4 | 20.2/32.5/24.9 |
| PA | 800 | 1.1 | 9 | 9.3/15.1/11.9 | 5.5/11.8/7.6 | 15.6/31.2/21.1 |
| MO | 3000 | 0.7 or 1.2 | 2.0-6.3 | 3.0/7.6/4.5 | 7.1/11.6/9.5 | 21.4/32.3/25.8 |
| MO | 800 | 0.7 or 1.2 | 2.0 to 6.3 | 5.1/7.4/6.1 | 3.4/9.8/7.3 | 15.3/21.5/19.0 |
| PA | 3000 | 0.7 or 1.2 | 2.0-6.3 | 5.3/10.8/7.9 | 5.4/9.8/8.7 | 20.7/29.9/26.0 |
| PA | 800 | 0.7 or 1.2 | 2.0-6.3 | 6.2/9.5/7.7 | 4.5/6.8/5.8 | 15.9/21.7/19.1 |

Applicants believe that injects, even very large injects, should not cause dE/dV to violate specifications under any circumstances. This can allow, e.g., for the system to perform large injects without causing excessive disruption to energy controllers. However, it is also believed that effective change in energy during injects can sometimes violate specifications, which may, however, be a misleading, or at least overly conservative view of the data. For example, FIG. 17 shows that even before the inject begins (i.e. the laser is essentially quiescent, firing in continuous mode at 3000 Hz), the worse case energy change violates the specification at several points, however, it is believed that this is not a valid way to assess performance. The ensemble average values, shown in the lines through the middle of the envelopes, would seem to be a much better indicator of true performance. Using these quantities to evaluate performance, it appears effective energy changes are also well within specification for all injects. However, it is also believed that the ensemble averaging can mask the effect of outliers or slight phase delays in otherwise large changes from inject to inject. Therefore, an alternative method could be used to compute the effective energy change during injects. A common way to "smooth" voltage data is to use a moving average or burst average. In this data, there were no bursts (i.e., the firing is in continuous mode), so one can alternatively select an appropriate window size to perform the moving average over. Applicants believe that a very conservative size is around 40 shots, e.g., based on a minimum window size specified for applicants XLA360 laser system specification. This will allow changes taking on the order of 250 milliseconds to be observable at 800 Hz. At 3000 Hz, even faster changes will be observable, which applicants believe to be sufficient, e.g., because gas injections occur over periods of 2 to 10 seconds (or more).

Using a 40 shot moving window to average voltage, and re-computing the effective energy change statistics of Table I yields the alternative results shown in Table II. Although the maximum values still remain above specification in most cases, the mean values are all within specification (albeit some are borderline). The ensemble averaging thus does not mask any gross effects, and is a valid analysis.

TABLE II

Alternative effective energy changes using 40-shot voltage moving average.

| Injected Chamber | Rep Rate, Hz | F2 inject, kPa | Bulk gas inject, kPa | % Energy change (min/max/mean) |
|---|---|---|---|---|
| MO | 3000 | 1.1 | 9 | 4.3/14.1/8.0 |
| MO | 800 | 1.1 | 9 | 3.5/9.5/6.8 |
| PA | 3000 | 1.1 | 9 | 5.5/11.8/8.0 |
| PA | 800 | 1.1 | 9 | 4.2/12.4/6.7 |
| MO | 3000 | 0.7 or 1.2 | 2.0-6.3 | 5.4/10.3/7.4 |
| MO | 800 | 0.7 or 1.2 | 2.0 to 6.3 | 3.3/9.7/6.6 |
| PA | 3000 | 0.7 or 1.2 | 2.0-6.3 | 3.7/7.6/6.3 |
| PA | 800 | 0.7 or 1.2 | 2.0-6.3 | 3.8/7.0/5.1 |

Changes in dE/dV, effective energy, and bandwidth were examined during injects for a range of injects sizes, in particular, very large injects were examined (1.1 kPa F2+9.0 kPa bulk gas). The data shows that even the very large injects will not cause changes in dE/dV or effective energy to violate exemplary specifications.

It will be understood by those skilled in the art that according to aspects of the disclosed subject matter discussed above, a method and apparatus has been disclosed for gas composition control in excimer lasers, e.g., narrow band gas discharge excimer lasers used in photolithography, wherein the gas composition is maintained at or near the original optimized pre-mix composition, while maintaining tightly controlled laser system output operating parameters, by replenishing fluorine and simultaneously flushing contaminant laden gas from the chamber, e.g., by regularly and frequently injecting into the chamber a small amount of chamber gas with, e.g., a mixture of halogen gas (typically fluorine) and buffer gas(es) (typically argon rare gas and neon buffer gas or krypton rare gas and neon buffer gas). These small gas replacement functions may be performed regularly at a fixed number of laser pulses (when the laser is discharging), or a fixed amount of time (when the laser is not discharging) or a combination of both. The amount of buffer gas or rare gas/buffer gas used in each gas replacement injection can remain the same over a relatively long time/number of pulses and is not controlled by the gas control system on an inject by inject basis. The amount of halogen gas used in each gas-replacement function can be varied, e.g., based upon laser operational signals, either in a long term basis to account for long time constant changes in laser operating input/output parameters or in a direct feedback loop based on one or more laser input or output operating parameters on an inject by inject basis, or a combination of both.

Exemplary laser system input/output operating parameters that may be used include values representative of the measured laser light bandwidth, light energy, discharge voltage, or discharge delay between chambers in a multi-chamber laser system, which values may, e.g., be normalized for other laser operating conditions, e.g., output energy and/or duty cycle, and may be considered to be indicators of the change of halogen concentration in the laser gas. When these signals differ from desired levels, e.g., from a selected reference value, e.g., $V_{REF}$, $E_{MOREF}$, $E_{95REF}$ or $dtMOPA_{REF}$, an estimate of the amount of halogen required can be computed, and injected during, e.g., an injection opportunity for a given chamber, a gas replacement function, which may be done, e.g., as discussed in co-pending application Ser. No. 10/953, 100, entitled MULTI-CHAMBERED EXCIMER OR MOLECULAR FLUORINE GAS DISCHARGE LASER FLUORINE INJECTION CONTROL referenced above for multi-chamber lasers or for single chamber lasers as discussed above and in one or more of the above referenced patents and pending patent applications.

According to aspects of an embodiment of the disclosed subject matter gas replenishment may be performed, as noted above, e.g., at every injection opportunity, i.e., at some selected period of time or number of gas discharges (shots) or a combination of both, e.g., since laser operation started, e.g., after installation and initial gas fill, and perhaps also some initial testing before beginning production operation, and/or some initial injection hold-off period. Such injection may be, e.g., regardless of any computed estimated consumption amount of the halogen for which an injection might be needed at the time of the injection opportunity based on some feedback estimation of halogen consumption. The amount of the buffer gas/rare gas in each replenishment may also be fixed. The fixed amount of the halogen injected at each injection opportunity can be varied from injection opportunity to injection opportunity, i.e., fixed for some injections but zero for others, as part of a replenishment function. That is to say, halogen, at some fixed amount may be injected every fourth injection or one forth of that amount injected in each injection for the same overall halogen (e.g., fluorine) replenishment rate.

Using a variety of derived signals and algorithms one may, e.g., according to aspects of an embodiment of the disclosed subject matter, predict the end of a gas life and dynamically determine when a refill will be required. Based upon a lithography user's pulse utilization pattern this may enable longer gas lifetime between refills, rather than relying on a simple and conservative refill schedule, such as a predetermined and relatively fixed refill schedule. Applicants through experimentation have determined that significantly longer gas lives may be attainable using a gas lifetime predictor coupled with such as a standard gas control algorithm.

Recent augmented gas control algorithms have demonstrated multiple times extension of gas life through advanced gas replenishment methods and higher performance estimators. Coupling the latest gas algorithm developments with the gas lifetime predictor may also provide the next quantum step forward in the evolution of gas management.

According to aspects of an embodiment of the disclosed subject matter, gas replenishment can be a partial replenishment while the light source continues to operate, called an inject, that may be also subject to constraints, e.g., to ensure the light properties remain within specifications. Alternatively, as used in the art, a full replenishment, called a refill, where all of the chamber gas is replaced while the laser is not firing has been employed. Refills, as noted above, are to be minimized because of the large disruption they introduce to both the light source and scanner operation. During such a refill replenishment almost all of the halogen has to be vacuum pumped from the chamber, including most of the contaminants produced during the previous gas life. Fresh halogen gas was then introduced to the chamber, along with bulk gas to reestablish eh initial starting pre-mix in the chamber and the laser efficiency returns almost entirely back to its baseline. However a drawback of exchanging the entire chamber of gas is that evacuation occurs on essentially and exponential time curve and the time to remove any given quantity of gas increases with time making the process of reducing the halogen gas partial pressure to at or about 0 very time consuming.

One promising method for decreasing replenishment time according to aspects of an embodiment of the disclosed subject matter can be, e.g., by performing only partial refills. Exchanging a fraction of the entire chamber's gas each time can give a benefit of, e.g., significant contaminant removal, while reducing considerably the stoppage time of the light source and associated downtime, particularly where the replenishment does not require scanner stoppage. In fact, if certain laser performance parameters can be kept in specification during such a partial refill, then there is no need to stop the light source, and hence there is no downtime. Also according to aspects of an embodiment of the disclosed subject matter since partial refills can, e.g., leave some level of contaminants remaining in the chamber, higher than a complete refill, they should occur frequently enough to avoid, e.g., an unacceptable voltage rise via the associated efficiency loss. Through the utilization of control algorithms that trigger injects, or partial refills and very less often even complete refills, applicants believe that the overall light source downtime could be reduced significantly.

Traditionally the primary purpose of the gas control algorithm was to provide baseline stability of the halogen gas concentration inside the discharge chamber, which was important as the halogen gas concentration affects laser performance parameters, including bandwidth, discharge voltage efficiency and energy stability. FIG. 19 shows how, e.g., $E_{95}$ bandwidth of light exiting the laser varies as halogen Gas (e.g., $F_2$/ArNe) concentration is adjusted, e.g., in the MO chamber on a typical exemplary MOPA configuration. The MO chamber response in the Cymer XLA platform (MOPA system) has been seen to be similar to the single chamber response of, e.g., a Cymer ELS-7010 platform. While a laser is firing, as noted above, fluorine is depleted, and current generation gas control algorithms regulate the rate and size of fluorine injected into the chamber such that certain baseline characteristics (e.g., bandwidth, discharge voltage efficiency and energy stability) all remain within specification. With such a current generation control algorithm, e.g., as discussed in one or more of the above noted patents/pending patent applications, e.g., a set of laser signals, e.g., including, voltage, MO and PA energy, voltage discharge efficiency, differential commutation time between the MO and PA, E95 bandwidth, pulse duty cycle and MO and PA chamber pressure and temperature signals may be routed through a signal processor and into two estimators to predict the $F_2$ concentration of the exemplary MO and PA chambers, or in a single chamber is such a laser system. The change in $F_2$ concentration information is fed into a control algorithm that determines the rate and size of $F_2$/ArNe injects into the MO and PA chambers to restore the proper $F_2$ concentration, such that key laser baseline performance characteristics remain within specification.

The stabilization of these baseline characteristics allows other laser control algorithms and actuators to optimize the performance of a particular laser attribute. For example, $E_{95}$ bandwidth can be regulated using other actuators once the baseline stability is reached using the gas control algorithm. However current generation gas control algorithms are only able to keep the halogen gas concentration fixed, and hence the baseline characteristics stable, for a finite period until, e.g., the accumulated contaminant levels can only be ameliorated by a refill. Without any addition of contaminant suppressing technology, an $F_2$ concentration control algorithm only can react to the increasing contamination as though it were a decrease in $F_2$ concentration. Essentially the $F_2$ estimators cannot observe the difference in effect between rising contaminant levels and falling $F_2$ concentration levels.

FIG. 24 illustrates a prediction of shots until a refill is required, according to aspects of an embodiment of the disclosed subject matter.

According to aspects of an embodiment of the disclosed subject matter control algorithms that employ, e.g., both baseline $F_2$ concentration stabilization and partial refill technology, and that allow the laser to keep firing while maintaining performance parameters within specification, can be utilized, e.g., to achieve significantly increased gas life capability. FIG. 23 illustrates in schematic and block diagramatic form an example of such a combination controller 250. According to aspects of an embodiment of the disclosed subject matter a parallelization of, e.g., an existing $F_2$ concentration control algorithm 252 and a contamination control algorithm 254 may be employed. These two control algorithms 252, 254 may, e.g., work in tandem to achieve the overall objective of very long light source operation before the need for an entire halogen gas replenishment, i.e., a full refill.

According to aspects of an embodiment of the disclosed subject matter two estimators 258 may be used to estimate the level of chamber contamination, e.g., using onboard laser operating parameter input signals and/or operating parameter output signals. These contaminant estimates may then be utilized by the contaminant control algorithm 254 to, e.g., initiate distributed partial refills. By distributing the partial refills into, e.g., tightly bounded increments, the algorithm 250 can provide a level of contaminant removal required for continuous operation, whilst simultaneously satisfying the constraints required to keep laser baseline performance characteristics within specification. Such a control algorithm 250, e.g., employing contaminant mitigation can be viable, e.g., because of reductions in contaminant sources from other technical advances in laser systems such as applicants' assignee Cymer's laser systems. Improved chamber contamination avoidance and cleaner chamber build procedures in part can enable utilization of gas control algorithms according to aspects of an embodiment of the disclosed subject matter, resulting in very long gas lives before a complete chamber refill is required or effectively eliminating them entirely.

Figure 11B:
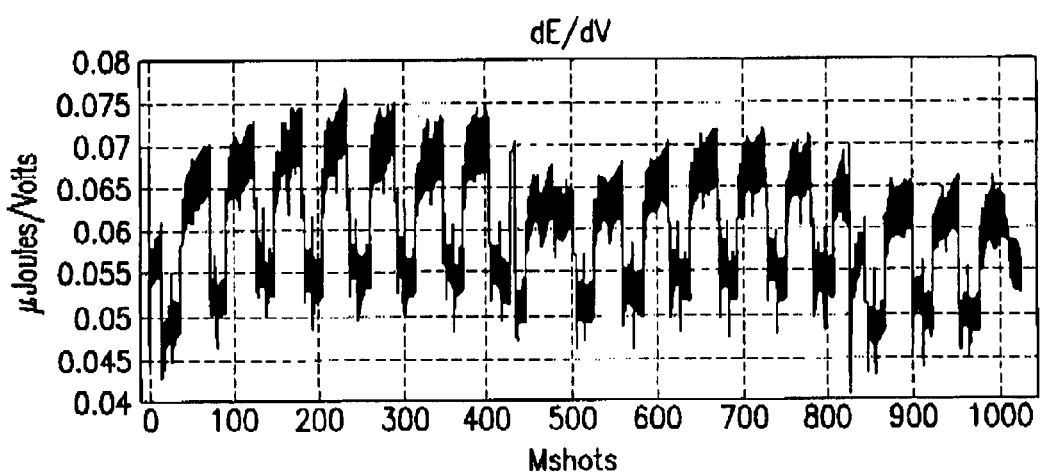

FIGS. 11 and 12A-C illustrate in the voltage chart and dE/dV chart and in the E95 (upper) chart, respectively, the commanded voltage, and efficiency in FIG. 11, and the E95 bandwidth in FIG. 12, of an exemplary laser system, e.g., a Cymer XLA100 platform. This shows, e.g., a negligible voltage rise over a period of 1 billion shots, while, e.g., changing the laser duty cycle to various values, and/or changing the target energy, without any additional chamber refills. Applicants have determined that the gas showed little or no signs of aging, even at 1 Bpulses. Such plots illustrate the gas lifetime extension possibilities using the gas control algorithms according to aspects of an embodiment of the disclosed subject matter which may be available.

Combining knowledge of (a) the rate at which optical modules age, (b) the rate at which fluorine is depleted and (c) the parameters that affect these rates, applicants have been able to construct dynamic models that can be used to predict the gas lifetime for a specific light source. Calibrating these models with the history of operational parameters since the start of the gas life can allow, e.g., prediction of the performance for some period into the future, given specific measurements from the laser.

FIG. 24 shows an example of how such a predictor may operate. The x-axis shows the current number of shots accumulated on the gas life. The y-axis is the predicted number shots remaining on this gas life before a refill is required. As an analogy, the x-axis can be though of as an odometer in a vehicle, and the y-axis as the distance-to-empty indicator. Initially, between the refill and approximately 300 Mshots, the predictor can, e.g., gather light: source performance data and also, e.g., filter it through a dynamic model of the process. As one increases the model confidence as to the length of the gas life increases, the predicted number of remaining shots can he seen to increase. Eventually, the number of remaining shots can be seen to begin to decrease as the gas life progresses, until the actual end of the gas life is reached. At this point, the predictor can, e.g., indicate that the light source can no longer meet performance specification requirements, and that a. refill is necessary. Under a simple schedule, e.g., such as indicated by the straight line in the lower left of the figure, with a forced refill at 300 Mshots, the gas life would have been arbitrarily and prematurely ended.

The effectiveness of the prediction depends upon the model accuracy and the confidence derived therein. The model accuracy in turn can be partially dependent upon how the light source is operated and how significant other unmodeled dynamics are. However, when coupled with the gas life extension algorithm according to aspects of an embodiment of the disclosed subject matter, such variability can become, e.g., less significant to the prediction, thus increasing the predictor's accuracy over a multitude of operating regimes. It will be understood by those skilled in the art that designs for longer life modules and best practices for rapid module exchange to ensure minimal impact to the availability budget can also be complemented, e.g., with control algorithms that maximize halogen gas lifetime before a complete refill is required, thus minimizing gas replenishment impact to productive time. Such algorithms may, e.g., employ a plurality of estimators and controllers operating in synergy to simultaneously regulate $F_2$ concentration and minimize chamber contaminant growth rate, such that very long gas lives in excess of one billion pulses can be attained before a refill is required.

It will be understood by those skilled in the art that a method and apparatus are herein disclosed which may comprise predicting the gas lifetime for a gas discharge laser light source for a photolithography process, the light source comprising a halogen containing lasing gas may comprise: utilizing at least one of a plurality of laser operating input and/or output parameters; utilizing a set of at least one parameter of utilization in the photolithography process to determine a gas use model in relation to the respective input or output parameter; predicting the end of gas life based upon the model and a measurement of the respective input or output parameter. The parameter may comprise a pulse utilization pattern. The method and apparatus may comprise performing gas management for a gas discharge laser light source for a photolithography process, the light source comprising a halogen containing lasing gas comprising: utilizing periodic and frequent partial gas refills comprising an inject comprising a mixture of halogen gas and bulk gas in generally the same ration as the premix ratio provided to the laser in a full gas refill, and in an amount less than two percent of the total gas pressure prior to the injection. The apparatus and method may comprise a predicting means for predicting the gas lifetime for a gas discharge laser light source for a photolithography process, the light source comprising a halogen containing lasing gas comprising: a means utilizing at least one of a plurality of laser operating input and/or output parameters; a means utilizing a set of at least one parameter of utilization in the photolithography process to determine a gas use model in relation to the respective input or output parameter; predicting the end of gas life based upon the model and a measurement of the respective input or output parameter. The apparatus and method may comprise a pulsed line narrowed gas discharge laser lithography light source comprising: a laser chamber containing a lasing medium gas comprising a halogen; a gas replenishment system comprising a controller executing a replenishment scheme comprising performing an inject at the time of the occurrence of an inject opportunity of a replenishing amount of the halogen along with a flushing amount of bulk gas. The halogen may comprise fluorine. The flushing amount may be sufficient to enables removal of a significant amount of contaminants from the lasing medium gas when the control system reduces pressure within the chamber to a level approximating the pressure within the chamber prior to the inject. The flushing amount enables the maintenance of generally a refill percentage of constituents of the lasing gas medium over extended time periods. The controller executing the replenishment scheme at inject opportunities occurring a regular intervals determined by factors comprising one or both of elapsed time and shot count. The replenishment scheme comprising performing an inject of a flushing amount of bulk gas without any halogen. The replenishment scheme may comprise performing an inject of a flushing amount of bulk gas without any halogen at selected ones of the inject opportunities. The gas controller may modify the selected replenishing amount according to an estimation of actual fluorine consumption in the chamber. The estimation of actual fluorine consumption may be based upon a measurement of a laser system input or output operating parameter that varies in a know way with a change in fluorine content in the lasing medium gas. The method and apparatus may comprise controlling gas replenishment in a pulsed line narrowed gas discharge laser lithography light source into a laser chamber containing a lasing medium gas comprising a halogen utilizing a method which may comprise in response to long term modifications in laser input/output operating parameter values adjusting one or more members of a subset derived from a set of measured laser operating system parameters to adjust laser efficiency by steps which may comprise: maximizing the time or shot accumulation before one or more of such operating parameter values exceeds an operational or user-chosen boundary condition, minimizing a subset, $S_1$, of such operating parameters in combination with maximization of a subset, $S_2$, of such parameters. The method and apparatus may comprise weighting and/or normalizing the subset members to assign an order of importance to the respective subset members. The subset $S_1$ or $S_2$ may comprise an empty set. The apparatus and method may comprise minimizing a norm value or other norm between a subset of parameters, $S_3$, and may comprise minimizing a norm value or other norm between a subset of parameters, $S_3$, and may comprise subjecting the maximizing or minimizing to soft constraint and/or as a hard constraint.

It will be understood by those skilled in the art that according to aspects of an embodiment of the disclosed subject matter the gas management system disclosed may be considered to be a combination of an open loop system and a feed back system, such as NAFFA of AFI. However, the open loop part and the feedback part are not generally considered as separate entities for purposes of this application. The disclosed subject matter can, e.g., compute a required $F_2$ inject size at all times. Then, e.g., at every inject opportunity, a gas inject may be performed. The injected gas may include both rare gas (ArNe), and halogen gas ($F_2$). The amount of ArNe injected may be fixed. The amount of $F_2$ injected may also be fixed, or determined from a computed $F_2$ inject size, based, e.g., on an estimated $F_2$ consumption, computed at the time of the inject opportunity. If this computed size is less than a selected Inject$_{min}$, which may be the lowest inject size the gas management system can inject with accuracy within some level of tolerance, or may even be set to zero, then Inject$_{min}$ may be injected. If this computed size is greater than a selected maximum injection amount, which may be based, e.g., on gas management system limits and/or a maximum injection without unwarranted disturbance of other laser output parameters, such as going out of specification, Inject$_{max}$, then Inject$_{max}$ may be injected. Otherwise, the computed size of $F_2$ may be injected. Thus, the system may compute a value of $F_2$ less than Inject$_{min}$ at an inject opportunity, but the system may ignore this computation and go ahead with the Inject$_{min}$ inject, anyway. If the system computes a value of $F_2$ greater than Inject$_{min}$ at an inject opportunity, it can inject that amount, up to a selected maximum, Inject$_{max}$. Also, as an alternative example, there may be a software configurable by which, e.g., if the computed $F_2$ is less than Inject$_{min}$, then only ArNe will be injected, and no $F_2$ will be injected in that case. This feature can be a configurable set at the factory during manufacture, but once it is set, may or may not be expected to change thereafter.

It will be understood by those skilled in the art that the aspects of embodiments of the disclosed subject matter disclosed above are intended to be preferred embodiments only and not to limit the disclosure of the disclosed subject matter in any way and particularly not to a specific preferred embodiment alone. Many changes and modification can be made to the disclosed aspects of embodiments of the disclosed subject matter that will be understood and appreciated by those skilled in the art. The appended claims are intended in scope and meaning to cover not only the disclosed aspects of embodiments of the disclosed subject matter but also such equivalents and other modifications and changes that would be apparent to those skilled in the art. In additions to changes and modifications to the disclosed and claimed aspects of embodiments of the disclosed subject matter noted above others could be implemented.

While the particular aspects of embodiment(s) of the LASER GAS INJECTION SYSTEM described and illustrated in this patent application in the detail required to satisfy 35 U.S.C. §112 is fully capable of attaining any above-described purposes for, problems to be solved by or any other reasons for or objects of the aspects of an embodiment(s) above described, it is to be understood by those skilled in the art that it is the presently described aspects of the described embodiment(s) of the disclosed subject matter are merely exemplary, illustrative and representative of the subject matter which is broadly contemplated by the disclosed subject matter. The scope of the presently described and claimed aspects of embodiments fully encompasses other embodiments which may now be or may become obvious to those skilled in the art based on the teachings of the Specification. The scope of the present LASER GAS INJECTION SYSTEM is solely and completely limited by only the appended claims and nothing beyond the recitations of the appended claims. Reference to an element in such claims in the singular is not intended to mean nor shall it mean in interpreting such claim element "one and only one" unless explicitly so stated, but rather "one or more". All structural and functional equivalents to any of the elements of the above-described aspects of an embodiment(s) that are known or later come to be known to those of ordinary skill in the art are expressly incorporated herein by reference and are intended to be encompassed by the present claims. Any term used in the specification and/or in the claims and expressly given a meaning in the Specification and/or claims in the present application shall have that meaning, regardless of any dictionary or other commonly used meaning for such a term. It is not intended or necessary for a device or method discussed in the Specification as any aspect of an embodiment to address each and every problem sought to be solved by the aspects of embodiments disclosed in this application, for it to be encompassed by the present claims. No element, component, or method step in the present disclosure is intended to be dedicated to the public regardless of whether the element, component, or method step is explicitly recited in the claims. No claim element in the appended claims is to be construed under the provisions of 35 U.S.C. §112, sixth paragraph, unless the element is expressly recited using the phrase "means for" or, in the case of a method claim, the element is recited as a "step" instead of an "act".

It will be understood also be those skilled in the art that, in fulfillment of the patent statutes of the United States, Applicant(s) has disclosed at least one enabling and working embodiment of each invention recited in any respective claim appended to the Specification in the present application and perhaps in some cases only one. For purposes of cutting down on patent application length and drafting time and making the present patent application more readable to the inventor(s) and others, Applicant(s) has used from time to time or throughout the present application definitive verbs (e.g., "is", "are", "does", "has", "includes" or the like) and/or other definitive verbs (e.g., "produces," "causes" "samples," "reads," "signals" or the like) and/or gerunds (e.g., "producing," "using," "taking," "keeping," "making," "determining," "measuring," "calculating"or the like), in defining an aspect/feature/element of, an action of or functionality of, and/or describing any other definition of an aspect/feature/element of an embodiment of the subject matter being disclosed. Wherever any such definitive word or phrase or the like is used to describe an aspect/feature/element of any of the one or more embodiments disclosed herein, i.e., any feature, element, system, sub-system, component, sub-component, process or algorithm step, particular material, or the like, it-should be read, for purposes of interpreting the scope of the subject matter of what applicant(s) has invented, and claimed, to be preceded by one or more, or all, of the following limiting phrases, "by way of example," "for example," "as an example," "illustratively only," "by way of illustration only," etc., and/or to include any one or more, or all, of the phrases "may be," "can be," "might be," "could be" and the like. All such features, elements, steps, materials and the like should be considered to be described only as a possible aspect of the one or more disclosed embodiments and not as the sole possible implementation of any one or more aspects/features/elements of any embodiments and/or the sole possible embodiment of the subject matter of what is claimed, even if, in fulfillment of the requirements of the patent statutes, Applicant(s) has disclosed only a single enabling example of any such aspect/feature/element of an embodiment or of any embodiment of the subject matter of what is claimed. Unless expressly and specifically so stated in the present application or the prosecution of this application, that Applicant(s) believes that a particular aspect/feature/element of any disclosed embodiment or any particular disclosed embodiment of the subject matter of what is claimed, amounts to the one an only way to implement the subject matter of what is claimed or any aspect/feature/element recited in any such claim, Applicant(s) does not intend that any description of any disclosed aspect/feature/element of any disclosed embodiment of the subject matter of what is claimed in the present patent application or the entire embodiment shall be interpreted to be such one and only way to implement the subject matter of what is claimed or any aspect/feature/element thereof, and to thus limit any claim which is broad enough to cover any such disclosed implementation along with other possible implementations of the subject matter of what is claimed, to such disclosed aspect/feature/element of such disclosed embodiment or such disclosed embodiment. Applicant(s) specifically, expressly and unequivocally intends that any claim that has depending from it a dependent claim with any further detail of any aspect/feature/element, step, or the like of the subject matter of what is recited in the parent claim or claims from which it directly or indirectly depends, shall be interpreted to mean that the recitation in the parent claim(s) was broad enough to cover the further detail in the dependent claim along with other implementations and that the further detail was not the only way to implement the aspect/feature/element claimed in any such parent claim(s), and thus be limited to the further detail of any such aspect/feature/element recited in any such dependent claim to in any way limit the scope of the broader aspect/feature/element of any such parent claim, including by incorporating the further detail of the dependent claim into the parent claim.

We claim:

1. An apparatus comprising:
a pulsed line narrowed gas discharge laser lithography light source comprising a master oscillator and amplifier;
the master oscillator having a laser chamber containing a lasing medium gas comprising a halogen;
the amplifier having a laser chamber containing a lasing medium gas comprising a halogen;
a gas replenishment system comprising a controller executing a replenishment scheme at inject opportunities occurring at regular intervals determined by factors comprising one or both of elapsed time and shot count;
the replenishment scheme comprising injecting a same quantity of a non-halogen containing gas composition at every inject opportunity and injecting an amount of gas containing halogen during at least one inject opportunity, said amount calculated using bandwidth and a discharge timing differential between the master oscillator and amplifier for master oscillator halogen consumption calculation and master oscillator pulse energy and amplifier discharge voltage for amplifier halogen consumption calculation.

2. The apparatus of claim 1 further comprising:
the halogen comprises fluorine.

3. The apparatus of claim 1 further comprising:
the non-halogen quantity is sufficient to enable removal of a significant amount of contaminants from the lasing medium gas when the system reduces pressure within the chamber to a level approximating the pressure within the chamber prior to the inject.

4. The apparatus of claim 2 further comprising:
the non-halogen quantity is sufficient to enables removal of a significant amount of contaminants from the lasing medium gas when the system reduces pressure within the chamber to a level approximating the pressure within the chamber prior to the inject.

5. A method comprising the steps of:
providing a pulsed, gas discharge laser source, the laser source having a master oscillator and amplifier, the master oscillator having a laser chamber containing a lasing medium gas comprising a halogen, the amplifier having a laser chamber containing a lasing medium gas comprising a halogen;
executing a gas replenishment scheme at inject opportunities occurring at regular intervals determined by factors comprising one or both of elapsed time and shot count, the replenishment scheme comprising;
injecting a same quantity of a non-halogen containing gas composition at every inject opportunity; and
injecting an amount of gas containing halogen during at least one inject opportunity, said amount calculated using bandwidth and a discharge timing differential between the master oscillator and amplifier for master oscillator halogen consumption calculation and master oscillator pulse energy and amplifier discharge voltage for amplifier halogen consumption calculation.

6. The method of claim 5 further comprising:
the halogen comprises fluorine.

7. The method of claim 5 further comprising:
the non-halogen quantity is sufficient to enable removal of a significant amount of contaminants from the lasing medium gas when the system reduces pressure within the chamber to a level approximating the pressure within the chamber prior to the inject.

8. A device comprising:
a pulsed, gas discharge laser source, the laser source having a master oscillator and amplifier, the master oscillator having a laser chamber containing a lasing medium gas comprising a halogen, the amplifier having a laser chamber containing a lasing medium gas comprising a halogen;
means for executing a gas replenishment scheme at inject opportunities occurring at regular intervals determined by factors comprising one or both of elapsed time and shot count, the replenishment scheme comprising:
means for injecting a same quantity of a non-halogen containing gas composition at every inject opportunity; and
means for injecting an amount of gas containing halogen during at least one inject opportunity, said amount calculated using bandwidth and a discharge timing differential between the master oscillator and amplifier for master oscillator halogen consumption calculation and master oscillator pulse energy and amplifier discharge voltage for amplifier halogen consumption calculation.

9. The device of claim 8 further comprising:
the halogen comprises fluorine.

10. The device of claim 8 further comprising:
the non-halogen quantity is sufficient to enable removal of a significant amount of contaminants from the lasing medium gas when the system reduces pressure within the chamber to a level approximating the pressure within the chamber prior to the inject.

* * * * *